US012781389B2

(12) United States Patent
Strobel et al.

(10) Patent No.: US 12,781,389 B2
(45) Date of Patent: Nov. 3, 2026

(54) BULK CRYSTALLINE 4H-SILICON THROUGH A METASTABLE ALLOTROPIC TRANSITION

(71) Applicant: Carnegie Institution of Washington, Washington, DC (US)

(72) Inventors: Timothy Strobel, Washington, DC (US); Thomas Shiell, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 606 days.

(21) Appl. No.: 18/201,016

(22) Filed: May 23, 2023

(65) Prior Publication Data

US 2023/0373794 A1 Nov. 23, 2023

Related U.S. Application Data

(60) Provisional application No. 63/344,919, filed on May 23, 2022.

(51) Int. Cl.

*C30B 29/06* (2006.01)
*C01B 33/021* (2006.01)
*C01B 33/037* (2006.01)

(52) U.S. Cl.

CPC ............ *C30B 29/06* (2013.01); *C01B 33/021* (2013.01); *C01B 33/037* (2013.01); *C01P 2002/54* (2013.01); *C01P 2002/60* (2013.01); *C01P 2002/72* (2013.01); *C01P 2002/77* (2013.01); *C01P 2002/82* (2013.01); *C01P 2002/84* (2013.01); *C01P 2002/85* (2013.01); *C01P 2004/04* (2013.01); *C01P 2006/40* (2013.01)

(58) Field of Classification Search

CPC ..... C30B 29/06; C01B 33/021; C01B 33/037; C01P 2002/54; C01P 2002/60; C01P 2002/72; C01P 2002/77; C01P 2002/82; C01P 2002/84; C01P 2002/85; C01P 2004/04; C01P 2006/40

See application file for complete search history.

(56) References Cited

PUBLICATIONS

Pandolfi et al. "Multi-scale characterization of hexagonal Si-4H: a hierarchical nanostructured material," arXiv-Materials Science, Oct. 6, 2021, DOI: 10.48550/arXiv.2110.02943. (Year: 2021).*

T. B. Shiell et al. "Bulk Crystalline 4H-Silicon through a Metastable Allotropic Transition," Physical Review Letters 126, 215701. (Year: 2021).*

Silvia Pandolfi. "High-pressure pathways towards new functional Si-based materials with tailored optoelectronic properties and their characterization", PhD Thesis, Sorbonne Université, 2019. (Year: 2019).*

(Continued)

*Primary Examiner* — Paul A Wartalowicz
*Assistant Examiner* — Nicholas A. Piro
(74) *Attorney, Agent, or Firm* — Stein IP, LLC

(57) ABSTRACT

A novel bulk form of 4H-Si, a crystalline allotrope of silicon and a novel method of manufacture. The novel material consists of highly oriented microcrystals of silicon in the 4H structure with no disordered material. The 4H-Si is derived from heating a second novel material $Si_{24}$ under proper conditions. The allotrope of silicon is produced as bulk, microcrystalline agglomerates.

26 Claims, 16 Drawing Sheets
(13 of 16 Drawing Sheet(s) Filed in Color)

(56) References Cited

PUBLICATIONS

Y. Zhang, Z. Iqbal, S. Vijayalakshmi, and H. Grebel, Stable Hexagonal-Wurtzite Silicon Phase by Laser Ablation, Appl. Phys. Lett. 75, 2758 (1999).
A. A. Nikolskaya, D. S. Korolev, A. N. Mikhaylov, A. I. Belov, A. A. Sushkov, N. O. Krivulin, K. R. Muhamatchin, A. A. Elizarova, M. O. Marychev, A. A. Konakov, D. I. Tetelbaum, and D. A. Pavlov, Light-Emitting 9R-Si Phase Formed by Kr+ Ion Implantation into SiO2/Si Substrate, Appl. Phys. Lett. 113, 1 (2018).
B. Haberl, J. E. Bradby, and T. A. Strobel, Pathways to Exotic Metastable Silicon Allotropes, Appl. Phys. Rev. 3, 040808 (2016).
L. Rapp, B. Haberl, C. J. Pickard, J. E. Bradby, E. G. Gamaly, J. S. Williams, and A. V. Rode, Experimental Evidence of New Tetragonal Polymorphs of Silicon Formed through Ultrafast Laser-Induced Confined Microexplosion, Nat. Commun. 6, 7555 (2015).
J. M. Besson, E. H. Mokhtari, J. Gonzalez, and G. Weill, Electrical Properties of Semimetallic Silicon III and Semiconductive Silicon IV at Ambient Pressure, Phys. Rev. Lett. 59, 473 (1987).
B. D. Malone, J. D. Sau, and M. L. Cohen, Ab Initio Survey of the Electronic Structure of Tetrahedrally Bonded Phases of Silicon, Phys. Rev. B 78, 035210 (2008).
H. Zhang, H. Liu, K. Wei, O. O. Kurakevych, Y. Le Godec, Z. Liu, J. Martin, M. Guerrette, G. S. Nolas, and T. A. Strobel, BC8 Silicon (Si-III) Is a Narrow-Gap Semiconductor, Phys. Rev. Lett. 118, 146601 (2017).
R. H. Wentorf and J. S. Kasper, Two New Forms of Silicon, Science. 139, 338 (1963).
O. O. Kurakevych, T. A. Strobel, D. Y. Kim, T. Muramatsu, and V. V. Struzhkin, Na—Si Clathrates Are High-Pressure Phases: A Melt-Based Route to Control Stoichiometry and Properties, Cryst. Growth Des. 13, 303 (2013).
D. Y. Kim, S. Stefanoski, O. O. Kurakevych, and T. A. Strobel, Synthesis of an Open-Framework Allotrope of Silicon, Nat. Mater. 14, 169 (2015).
J. S. Kasper, P. Hagenmuller, M. Pouchard, and C. Cros, Clathrate Structure of Silicon Na8Si46 and NaxSi136 (X<11), Science. 150, 1713 (1965).
Z. Jouini, O. Kurakevych, H. Moutaabbid, Y. Le Godec, M. Mezouar, and N. Guignot, Phase Boundary between Na—Si Clathrates of Structures I and II at High Pressures and High Temperatures, J. Superhard Mater. 38, 66 (2016).
J. Gryko, P. F. McMillan, R. F. Marzke, G. K. Ramachandran, D. Patton, S. K. Deb, and O. F. Sankey, Low-Density Framework Form of Crystalline Silicon with a Wide Optical Band Gap, Phys. Rev. B 62, R7707 (2000).
A. Ammar, C. Cros, M. Pouchard, N. Jaussaud, J. M. Bassat, G. Villeneuve, M. Duttine, M. Ménétrier, and E. Reny, On the Clathrate Form of Elemental Silicon, Si136: Preparation and Characterisation of NaxSi136 (X-→0), Solid State Sci. 6, 393 (2004).
C. Persson and E. Janzen, Electronic Band Structure in Hexagonal Close-Packed Si Polytypes, J. Phys. Cond. Matter 10, 10549 (1998).
C. Raffy, J. Furthmüller, and F. Bechstedt, Properties of Hexagonal Polytypes of Group-IV Elements from First-Principles Calculations, Phys. Rev. B 66, 1 (2002).
E. A. Fitzgerald, GeSi/Si Nanostructures, Annu. Rev. Mater. Sci. 25, 417 (1995).
S. Barth, M. S. Seifner, and S. Maldonado, Metastable Group IV Allotropes and Solid Solutions: Nanoparticles and Nanowires, Chem. Mater. 32, 2703 (2020).
C. Rodl, T. Sander, F. Bachstedt, J. Vidal, P. Olsson, S. Laribi, and J.-F. Guillemoles, Wurtzite Silicon as a Potential Absorber in Photovoltaics: Tailoring the Optical Absorption by Applying Strain, Phys. Rev. B 92, 045207 (2015).
P. D. Ownby, X. Yang, and J. Liu, Calculated X-Ray Diffraction Data for Diamond Polytypes, J. Am. Ceram. Soc. 75, 1876 (1992).
R. J. Kobliska and S. A. Solin, Raman Spectrum of Wurtzite Silicon, Phys. Rev. B 8, 3799 (1973).
H. M. Jennings and M. H. Richman, A Hexagonal (Wurtzite) Form of Silicon, Science. 193, 1242 (1976).
F. J. Lopez, U. Givan, J. G. Connell, and L. J. Lauhon, Silicon Nanowire Polytypes: Identification by Raman Spectroscopy, Generation Mechanism, and Misfit Strain in Homostructures, ACS Nano 5, 8958 (2011).
C. Cayron, M. Den Hertog, L. Latu-Romain, C. Mouchet, C. Secouard, J.-L. Rouviere, E. Rouviere, and J.-P. Simonato, Odd Electron Diffraction Patterns in Silicon Nanowires and Silicon Thin Films Explained by Microtwins and Nanotwins, J. Appl. Crystallogr. 42, 242 (2009).
A. Kailer, Y. G. Gogotsi, and K. G. Nickel, Phase Transformations of Silicon Caused by Contact Loading, J. Appl. Phys. 81, 3057 (1997).
A. Fontcuberta I Morral, J. Arbiol, J. D. Prades, A. Cirera, and J. R. Morante, Synthesis of Silicon Nanowires with Wurtzite Crystalline Structure by Using Standard Chemical Vapor Deposition, Adv. Mater. 19, 1347 (2007).
H. I. T. Hauge, M. A. Verheijen, S. Conesa-Boj, T. Etzelstorfer, M. Watzinger, D. Kriegner, I. Zardo, C. Fasolato, F. Capitani, P. Postorino, S. Kolling, A. Li, S. Assali, J. Stangl, and E. P. A. M. Bakkers, Hexagonal Silicon Realized, Nano Lett. 15, 5855 (2015).
B. V. Tanikella, A. H. Somasekhar, A. T. Sowers, R. J. Nemanich, and R. O. Scattergood, Phase Transformations during Microcutting Tests on Silicon, Appl. Phys. Lett. 69, 2870 (1996).
J. Yan, Laser Micro-Raman Spectroscopy of Single-Point Diamond Machined Silicon Substrates, J. Appl. Phys. 95, 2094 (2004).
S. Pandolfi, C. Renero-Iecuna, Y. Le Godec, B. Baptiste, N. Menguy, M. Lazzeri, C. Gervais, K. Spektor, W. A. Crichton, and O. O. Kurakevych, Nature of Hexagonal Silicon Forming via High-Pressure Synthesis: Nanostructured Hexagonal 4-H Polytype, Nano Lett. 18, 5989 (2018).
E. Lopex-Cruz and M. Cardona, Raman Spectra of Two New Modifications of Germanium: Allo-Germanium and 4H-Ge, Solid State Commun. 45, 787 (1990).
F. Kiefer, V. Hlukhyy, A. J. Karttunen, T. F. Fässler, C. Gold, E. W. Scheidt, W. Scherer, J. Nylén, and U. Häussermann, Synthesis, Structure, and Electronic Properties of 4H-Germanium, J. Mater. Chem. 20, 1780 (2010).
D. Porezag and M. R. Pederson, Infrared Intensities and Raman-Scattering Activities within Density-Functional-Theory, Phys. Rev. B 54, (1996).
K. E. Spear, A. W. Phelps, and W. B. White, Diamond Polytypes and Their Vibrational-Spectra, J. Mater. Res. 5, 2277 (1990).
L. Zhu, R. E. Cohen, and T. A. Strobel, Phase Transition Pathway Sampling via Swarm Intelligence and Graph Theory, J. Phys. Chem. Lett. 10, (2019).
D. Sheppard, P. Xiao, W. Chemelewski, D. D. Johnson, and G. Henkelman, A Generalized Solid State Nudged Elastic Band Method, J. Chem. Phys. 136, (2012).
Zhisheng Zhao et al., Properties of the exotic metastable ST12 germanium allotrope, Nature Communications 8, 13909 (2017).
Thomas B. Shiell et al., Bulk crystalline 4H-silicon through a metastable allotropic transition, Phys Rev Lett. (2021).
M. Guerette, M. D. Ward, K. A. Lokshin, A. T. Wong, H. Zhang, S. Stefanoski, O. Kurakevych, Y. Le Godec, S. J. Juhl, N. Alem, Y. Fei, and T. A. Strobel, Synthesis and Properties of Single-Crystalline Na4Si24, Cryst. Growth Des. 18, 7410 (2018).
M. Guerette, M. D. Ward, L. Zhu, and T. A. Strobel, Single-Crystal Synthesis and Properties of the Open-Framework Allotrope Si24, J. Phys. Condens. Matter 32, 194001 (2020).
T. B. Shiell and T. A. Strobel, Compression of Sodium-Filled and Empty Open-Framework Si24 under Quasihydrostatic and Nonhydrostatic Conditions, Phys. Rev. B 102, 94107 (2020).
C. Prescher and V. B. Prakapenka, Dioptas: A Program for Reduction of Two-Dimensional X-Ray Diffraction Data and Data Exploration, High Press. Res. 35, 223 (2015).
J. P. Perdew, K. Burke, and M. Ernzerhof, Generalized Gradient Approximation Made Simple, Phys. Rev. Lett. 77, (1996).
G. Kresse and J. Furthmuller, Efficient Iterative Schemes for Ab Initio Total- Energy Calculations Using a Plane-Wave Basis Set, Phys. Rev. B 54, 11169 (1996).
P. E. Blochl, Projector Augmented-Wave Method, Phys. Rev. B 50, 17953 (1994).

(56) References Cited

PUBLICATIONS

G. Kresse and D. Joubert, From Ultrasoft Pseudopotentials to the Projector Augmented Wave Method, Phys. Rev. B 59, (1998).
A. Fonari and S. Stauffer, Vasp_raman.Py., Https://Github.Com/Raman-Sc/VASP/ (2013).
J. Heyd, G. E. Scuseria, and M. Ernzerhof, Hybrid Functionals Based on a Screened Coulomb Potential, J. Chem. Phys. 118, (2003).

* cited by examiner

BULK CRYSTALLINE 4H-SILICON THROUGH A METASTABLE ALLOTROPIC TRANSITION

CROSS-REFERENCE TO RELATED APPLICATIONS

This application claims the benefit of U.S. Provisional Application No. 63/344,919, filed May 23, 2022, in the U.S. Patent and Trademark Office. All disclosures of the document named above are incorporated herein by reference.

STATEMENT OF INTEREST

This invention was made with Government support by the National Science Foundation, Division of Material Research (NSF-DMR) under award number 1809756. Portions of this work were performed at HPCAT (Sector 16), Advanced Photon Source (APS), Argonne National Laboratory. HPCAT operations are supported by DOE-NNSA's Office of Experimental Sciences. The Advanced Photon Source is a U.S. Department of Energy (DOE) Office of Science User Facility operated for the DOE Office of Science by Argonne National Laboratory under Contract No. DE-AC02-06CH11357. The U.S. Government has certain rights in the invention.

BACKGROUND OF THE INVENTION

The 4H phase of silicon was likely originally found in 1963 by Wentorf and Kasper after heating BC8 silicon. This was misidentified as the 2H phase, which was corrected by Pandolfi et al. in 2018. In prior 4H formation, from the BC8 pathway, the 4H silicon is nanocrystalline and coexists with amorphous/disordered material. The 4H phase of Si has not been produced in high-quality bulk form prior to the present invention and has not been produced by the novel process taught herein prior to the present invention.

Diamond-cubic (DC) Si is the thermodynamically stable form at ambient conditions, and represents the major constituent of semiconductor components of electrical devices in the semiconductor industry. Over the last 50 years, several new allotropes of Si have been synthesized using a range of techniques including deposition, implantation, high-pressure methodologies, and confined microexplosions. Each of these allotropes possess unique electronic structures and physical properties, which may be advantageous to future devices and help overcome intrinsic limitations of the DC-Si structure. Among the known Si allotropes, the R8, BC8, lonsdaleite, and clathrate or clathrate-like structures have been stabilized and characterized at ambient conditions using bulk methods.

Hexagonal Si with various stacking schemes has been of interest since the 1960s. Theoretical calculations consistently indicate that various hexagonal allotropes possess indirect band gaps of similar magnitude to DC-Si, but tunable direct gaps might be achieved through various substitution schemes, for example using Ge, or by the application of strain. A thorough description of possible hexagonal polytypes and their stacking is given by Ownby et al. 2H-Si (lonsdaleite, analogous to the wurtzite structure for a binary system, though later to be identified as 4H-Si) was first identified by Wentorf and Kasper after annealing BC8-Si (a phase recovered from high-pressure conditions) in air between 200-600° C. The same 2H-Si synthesis pathway was later confirmed by Kobliska et al. and a similar material was produced as a by-product from a reaction-bonded $Si_3N_4$ experiment. More recently, crystalline 2H-Si (with average crystal size ~20 μm) was physically deposited with simultaneous UV laser ablation in the form of a thin film, and identified using electron diffraction. Furthermore, several studies report the synthesis of Si nanowires with varying degrees of hexagonality referred to as non-DC polytypes, and identify many other forms with ordered hexagonal stacking synthesized via indentation, deposition, and diamond machining. Another recently discovered complex polytype in the 9R-Si structure.

Previous reports of hexagonal Si produced from BC8-Si show broad, ambiguous diffraction patterns (or none at all), broad overlapping Raman peaks, and tend to coexist with disordered, amorphous Si or defective nanocrystalline regions. This makes the specific hexagonal product difficult to identify. On the other hand, clear evidence for 2H-Si on the nanometer scale was obtained by depositing Si on a hexagonal GaP substrate. Recently, the 2H stacking sequence for the product obtained by annealing recovered BC8-Si was challenged by Pandolfi et al., who suggested that the hexagonal phase may actually be the 4H-Si structure. While their broad powder X-ray diffraction (XRD) and Raman peaks were suggestive of nanocrystals with a hexagonal stacking sequence, the transmission electron microscopy (TEM) and selective area electron diffraction (SAED) could only be described by 4H-Si. While 2H-Si and 4H-Si are both metastable with respect to DC-Si, the 4H sequence was predicted to be ~8 meV/atom lower energy than 2H. Large crystals of 4H-Si or 4H-C had never been synthesized, isolated, and characterized.

SUMMARY OF THE INVENTION

The present invention is the first creation of highly oriented 4H phase silicon microcrystals with no disordered material. Our innovation is to produce 4H-Si by heating $Si_{24}$, another novel silicon allotrope. 4H-Si forms when $Si_{24}$ is heated above 300° C. at atmospheric pressure, and also when heated to 800° C. at high pressure near 9 GPa. The 4H-Si produced from the novel $Si_{24}$ method consists of highly oriented microcrystals with no disordered material. This has enabled a high-quality product with unambiguous Raman spectra and X-ray diffraction patterns, and has also enabled the first characterization of the optical band gap. 4H-Si is an indirect band gap semiconductor with a band gap near 1.2 eV. Additional transmission electron microscopy measurements confirm the 4H stacking sequence.

The synthesis of bulk, highly oriented, crystalline 4H hexagonal silicon (4H-Si) occurs through a metastable phase transformation upon heating the single-crystalline $Si_{24}$ allotrope. Remarkably, the resulting 4H-Si crystallites exhibit an orientation relationship with the $Si_{24}$ crystals, indicating a structural relationship between the two phases. Optical absorption measurements reveal that 4H-Si exhibits an indirect band gap near 1.2 eV, in agreement with first principles calculations. The metastable crystalline transition pathway provides a novel route to access bulk crystalline 4H-Si in contrast to previous transformation paths that yield only nanocrystalline/disordered materials.

The invention is a semiconducting form of silicon with potential application in microelectronics, optoelectronics and energy conversion technology. The semiconducting properties of 4H-Si are similar to that of "normal" cubic Si, which is used in semiconductor technology. The in-plane elastic isotropy of the 4H phase can have impacts on the design, fabrication and performance of microelectromechanical systems such as timing resonators and mode-matched gyroscopes, similar to 4H-SiC used now.

Crystalline 4H hexagonal silicon has been characterized by X-ray diffraction, Raman spectroscopy, transmission electron microscopy, selected area diffraction, optical spectroscopy and by ab initio electronic structure calculations. The material is a microcrystalline solid that exists as black-colored agglomerates up to 1 mm in dimension. It is an indirect band gap semiconductor with a band gap near 1.2 eV.

All previous 4H-Si samples were nanocrystalline and coexist with disordered material making structural identification ambiguous. 4H-Si created as the present invention, was unambiguously identified using Raman spectroscopy, X-ray diffraction, transmissions electron microscopy, selected area electron diffraction, as well as density functional theory calculations. Sharp Raman and diffraction lines are unprecedented and reveal the high-quality of samples produced from the $Si_{24}$ pathway as compared with the BC8 pathway.

4H-Si here is produced via a new pathway by heating $Si_{24}$ (another silicon allotrope created in 2015, see WO 2015/006322 naming Strobel, Kim, and Kurakevych as inventors and incorporated herein in its entirety.) 4H-Si is produced by heating $Si_{24}$ between vacuum pressure ($10^{-3}$ torr) and 9 GPa at temperatures between 300-800° C. Structural conversion to 4H-Si is dependent on temperature and heating duration and structural conversion to 4H-Si also occurs in the presence of iodine and when heating $Na_4Si_{24}$. Single-crystalline $Si_{24}$ results in highly oriented 4H-Si grains, whereas powder $Si_{24}$ results in powdered 4H-Si. Samples are black powder or multicrystalline agglomerates with grain sizes near 0.5 microns.

A structural relationship was identified between $Si_{24}$ and 4H-Si that results in a low-energy-barrier pathway for the structural transition. 4H-Si was identified to be an indirect band gap semiconductor with a band gap near 1.2 eV by optical absorption measurements and density functional theory calculations. 4H-Si exhibits some similar semiconducting properties to "normal" diamond-Si, which is commonly used in semiconductor applications including microelectronic and photovoltaic devices.

The 4H-Si phase has a lower-energy direct interband transition than the diamond-Si phase. 4H-Si shows significant differences in the conduction band minima. Type-I and Type-II heterostructures may be possible by combining different polytypes. The elastic properties of 4H-Si are of particular interest for micro-electromechanical systems (MEMS). The in-plane elastic isotropy of 4H-Si would have major impacts on the design, fabrication and performance of timing resonators and mode-matched gyroscopes. These benefits are currently being utilized to produce improved MEMS devices with 4H-SiC.

DESCRIPTION OF THE FIGURES

The patent or application file contains at least one drawing executed in color. Copies of this patent or patent application publication with color drawings will be provided by the Office upon request and payment of the necessary fee.

DETAILED DESCRIPTION OF THE INVENTION

A metastable pathway to produce crystalline 4H-Si by annealing $Si_{24}$ crystals at moderate temperature, thus providing a novel path to isolate bulk samples with exceptional crystallinity in comparison to previous work.

$Si_{24}$ is a low-density orthorhombic Si allotrope that contains zeolite-like channels along the crystallographic a-axis. While $Si_{24}$ is metastable with respect to DC-Si by ~90 meV/atom, it may persist to temperatures >400° C. upon heating for durations of ~15 min. Nevertheless, the high-temperature and long-term stability of $Si_{24}$ remains unclear. During annealing studies to address these questions, a series of new powder diffraction lines were observed, that coexist with $Si_{24}$ after long-duration heating (days) above 200° C. and fully dominate the patterns above 450° C. see graphs of FIG. 5.

Figure 5:
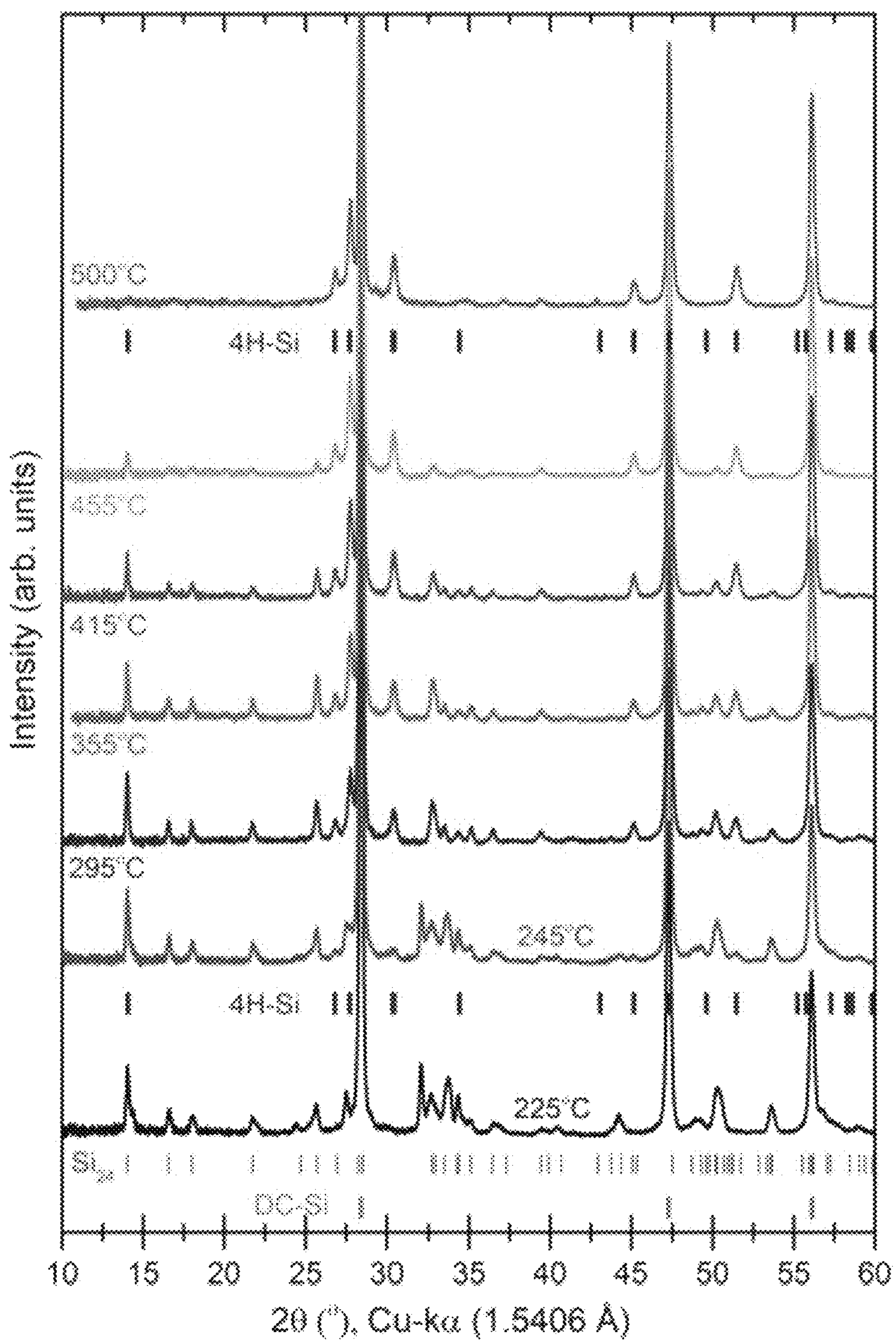
FIG. 5 is a graph of a series of XRD patterns captured on a Bruker D8-diffractometer (using a Cu-kα source) which shows the evolution of a $Si_{24}$ powder transforming toward 4H-Si.

In FIG. 5, a series of XRD patterns captured on a Bruker D8-diffractometer (using a Cu-kα source) demonstrate the evolution of a $Si_{24}$ powder transforming toward 4H-Si. These patterns were measured from 2θ=20-65° with a Vantec area detector in four stages with 15° steps, and the samples were rotated during the measurement to improve powder averaging statistics. The patterns were integrated using Diffrac. Suite EVA software, and phases were matched to the patterns using the JADE software package. The precursor powder is ~70 wt. % $Si_{24}$ with the remainder being DC-Si. The powder was created after a 5-week anneal of $Na_4Si_{24}$ in air at 200° C. to remove Na, and was then further annealed in air for 15 minutes at each incremental temperature step up to 500° C. Not all temperature steps are shown here. The first sign of reflections from the 4H-Si structure appear after annealing at 245° C. for 15 minutes. The transformation progresses as the temperature increases up to 500° C., at which point only DC and 4H-Si are observable.

These reflections cannot be described by DC-Si and indicate the presence of an intermediate phase that forms before relaxation to the thermodynamic ground state. To understand this intermediate phase, the phase transition was studied using synchrotron X-ray diffraction with single-crystalline $Si_{24}$. Bulk single crystals of $Si_{24}$ were recently demonstrated and the same synthetic approach was followed here.

Figure 6A:
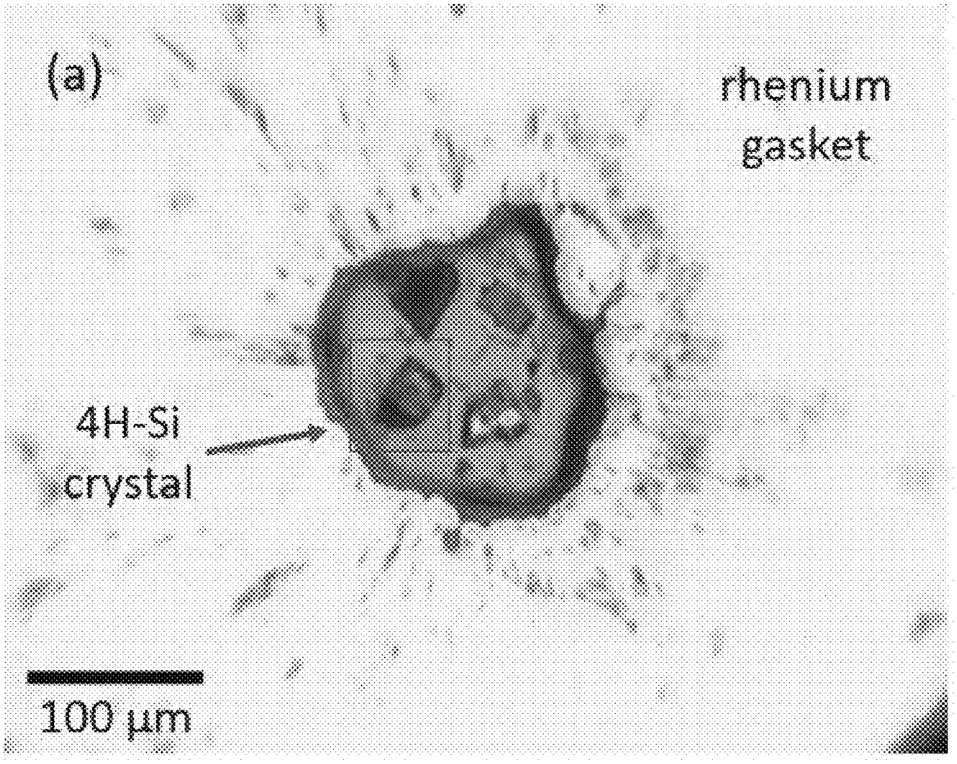
FIG. 6A shows optical images of the 4H-Si crystals following the high-pressure laser heating procedure. Four crystals were compressed and heated in the diamond anvil cell (DAC).
Figure 6B:
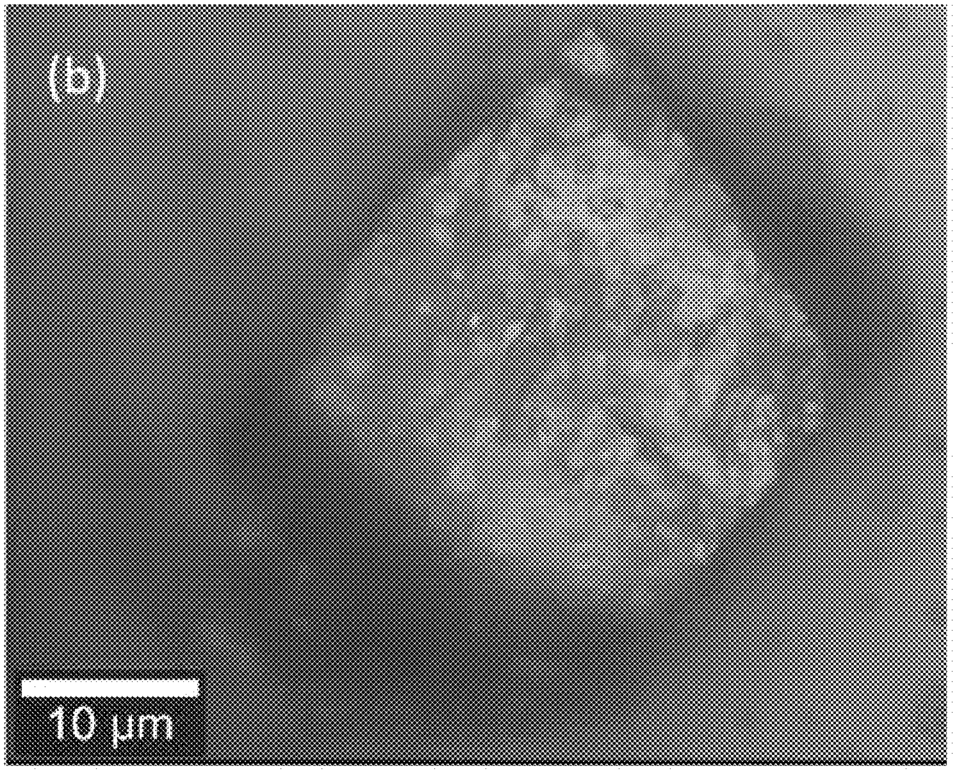
FIG. 6B is a magnified image of the specific crystal that was processed in the FIB and analyzed using the TEM.

Some optical images of experimental samples are illustrated in FIGS. 6A and 6B which are optical images of the 4H-Si crystals following the high-pressure laser heating procedure. In FIG. 6A, all four compressed crystals in the diamond anvil cell (DAC) following decompression are shown and in 6B, a magnified image of the specific crystal that was processed in the FIB and analyzed using the TEM is pictured. The crystal shown in 6B was heated to ~1060 K for ~2 minutes at 9 GPa. The high-pressure annealed samples produce identical products to those annealed at 1 atm or under vacuum. One of the crystals shown in FIG. 6A was set aside as a control sample and was not heated. Raman spectroscopy measurements after decompression show that it had remained crystalline $Si_{24}$.

Figure 1A:
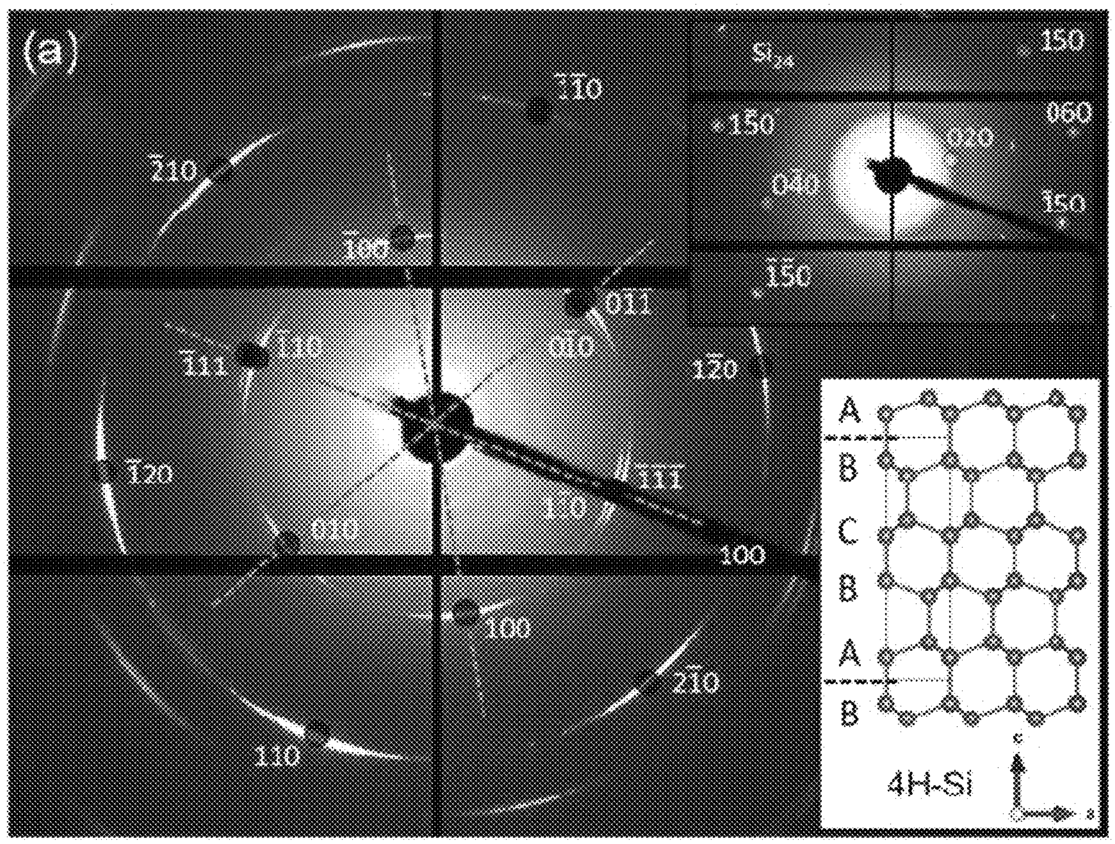
FIG. 1A is a two-dimensional X-Ray diffraction (2D XRD) pattern of a multicrystalline 4H-Si sample produced after heating a $Si_{24}$ single crystal at 300° C. for four days.

The starting $Si_{24}$ crystals are oriented along [001] due to the cleavage habit in the a-b plane, and exhibit sharp single-crystal diffraction spots. Upon annealing crystals sealed under vacuum in quartz tubes in a benchtop furnace, typically near 300° C. for four days, the sharp single-crystal spots from $Si_{24}$ disappear, and highly oriented multicrystalline arcs appear as shown in FIG. 1A. The sixfold hexagonal symmetry of a multicrystalline 4H-Si sample produced after heating a $Si_{24}$ single crystal at 300° C. for four days is illustrated in the XRD pattern of FIG. 1A. The green dashed lines which are at 60° intervals, are added for clarity and emphasis. Reflections in addition to those along [001] are observed as the samples were rotated with respect to the X-ray beam. The upper inset shows the single-crystalline nature of $Si_{24}$ precursor oriented along [001], and the lower inset shows a model of the 4H-Si structure with ABCB stacking generated using VESTA-v3 software.

Figure 1B:
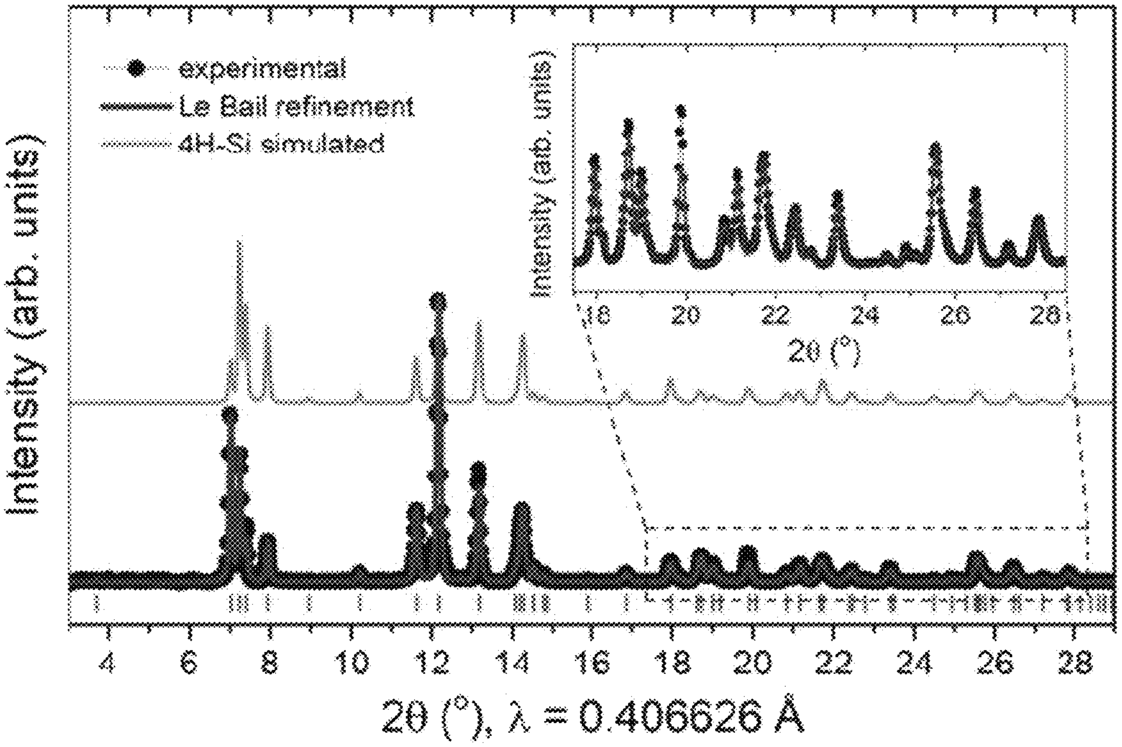
FIG. 1B illustrates the powder diffraction pattern produced by the sample of FIG. 1A.

The arcs show sixfold symmetry indicative of a hexagonal lattice, and display an azimuthal spread of 15.3(5°), which reflects the misorientation of individual grains. Remarkably, the preservation of orientational order in the annealed samples indicates a structural relationship between the $Si_{24}$ [001] direction and the hexagonal axis of the product. The samples exhibit a large distribution of grains, obscuring the resolution of the hexagonal structure using conventional single-crystal XRD. However, by averaging multiple diffraction patterns over different orientations, a powder pattern was approximated. The powder pattern indexes to a primitive hexagonal lattice with a ≈3.84 Å, c≈12.59 Å, which is consistent with the previous reports of 4H-Si. Because of the presence of preferred orientation, the data are not suitable for Rietveld refinement, however, full-profile Le Bail refinement produces excellent agreement with the 4H-Si space group $P6_3/mmc$ with lattice parameters a=3.837 (3) Å, c=12.586(5) Å, as shown in FIG. 1B. The XRD pattern is not consistent with other possible hexagonal stacking sequences, and compared with previous reports of bulk 2H- or 4H-Si, these samples exhibit exceptional micro-crystallinity.

The power diffraction pattern illustrated in FIG. 1B shows the averaging of multiple sample orientations of the sample of FIG. 1A, the experimental data are shown as dots. Experimental data are modeled with a Le Bail fit using the GSAS-II software. Allowed Bragg peaks for the 4H-Si structure are indicated by the tick marks below the pattern at the bottom of the chart. A 4H-Si powder pattern simulated using atomic positions from the 4H-Si reference structure is shown above the experimental data for comparison of powder averaging. A magnified high-angle region of the experimental diffraction pattern with the refined pattern overlayed is shown in the inset. The correlation between predicted pattern and experimental data is extremely consistent.

Figure 2:
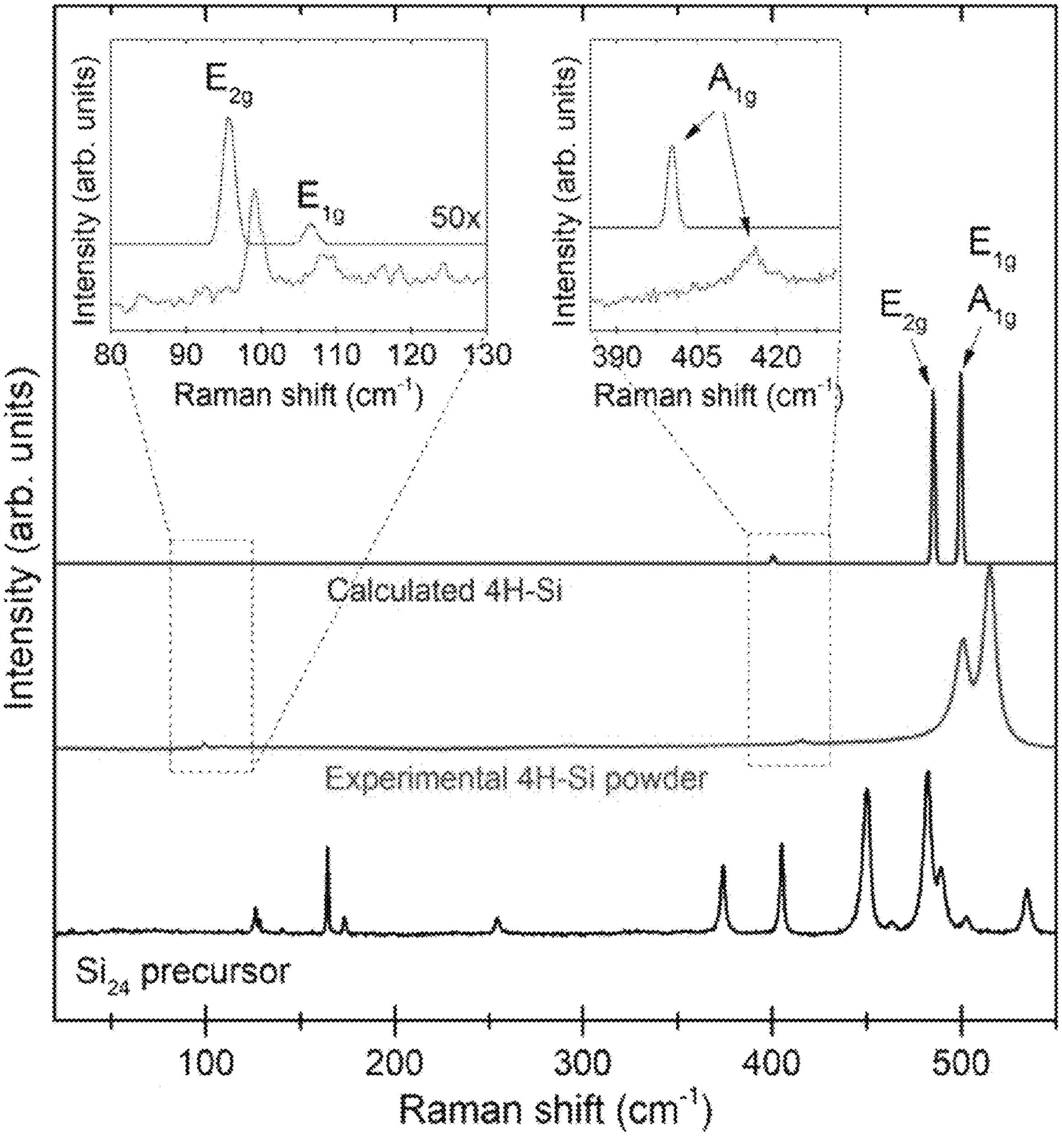
FIG. 2 illustrates the Raman spectra of the $Si_{24}$ crystal precursor and 4H-Si powder of the present invention, compared to a calculated 4H-Si Raman spectrum.

Raman spectra of the single-crystalline $Si_{24}$ precursor and heated product are shown in FIG. 2. As noted in reference to the insets of FIG. 2, the experimentally observed Raman spectrum of 4H-Si is compared with the calculated Raman spectrum of 4H-Si shown with Gaussian peaks of an arbitrary width. Lower-frequency regions of the calculated Raman spectrum show that the weaker ($E_{2g}$, $E_{1g}$, and $A_{1g}$) peaks from 4H-Si match the experimental observations, confirming formation of 4H-Si using the present invention.

Recovered samples were powdered to eliminate any possible effects of crystal orientation on scattered intensity. Samples annealed over a broad range of pressure—temperature conditions produce characteristic Raman spectra that contain two strong resolvable peaks near 500 $cm^{-1}$, one weak peak at 416 $cm^{-1}$, and two very weak peaks near 100 $cm^{-1}$. By calculating Brillouin zone-center phonons and Raman intensities using density functional perturbation theory as implemented in Vienna ab initio simulation package (VASP), Si Raman spectra from structures with different possible hexagonal stacking sequences were generated as illustrated in the below Table 1: Raman mode frequencies for the DC-, 2H-, 4H-, and 6H-Si structures, measured experimentally and calculated using the DFT-PBE functional.

TABLE 1

| DC-Si Mode | Calc. | Exp. | 2H-Si Mode | Calc. | 4H-Si Mode | Calc. | Exp. | 6H-Si Mode | Calc. |
|---|---|---|---|---|---|---|---|---|---|
| $T_{2g}$ | 503.3 | 520.9 | $E_{2g}$ | 479.9 | $E_{1g}$ | 95.7 | 100 | $E_{2g}$ | 75.3 |
| | | | $E_{1g}$ | 498.0 | $E_{2g}$ | 106.5 | 108 | $E_{1g}$ | 101.2 |
| | | | $A_{1g}$ | 498.7 | $A_{1g}$ | 400.3 | 417 | $A_{1g}$ | 290.4 |
| | | | | | $E_{2g}$ | 485.1 | 502 | $A_{1g}$ | 448.2 |
| | | | | | $A_{1g}$ | 499.4 | 516 | $E_{2g}$ | 479.1 |
| | | | | | $E_{1g}$ | 499.8 | 516 | $E_{1g}$ | 481.4 |
| | | | | | | | | $E_{2g}$ | 492.0 |
| | | | | | | | | $A_{1g}$ | 500.5 |
| | | | | | | | | $E_{1g}$ | 500.6 |

Figure 7:
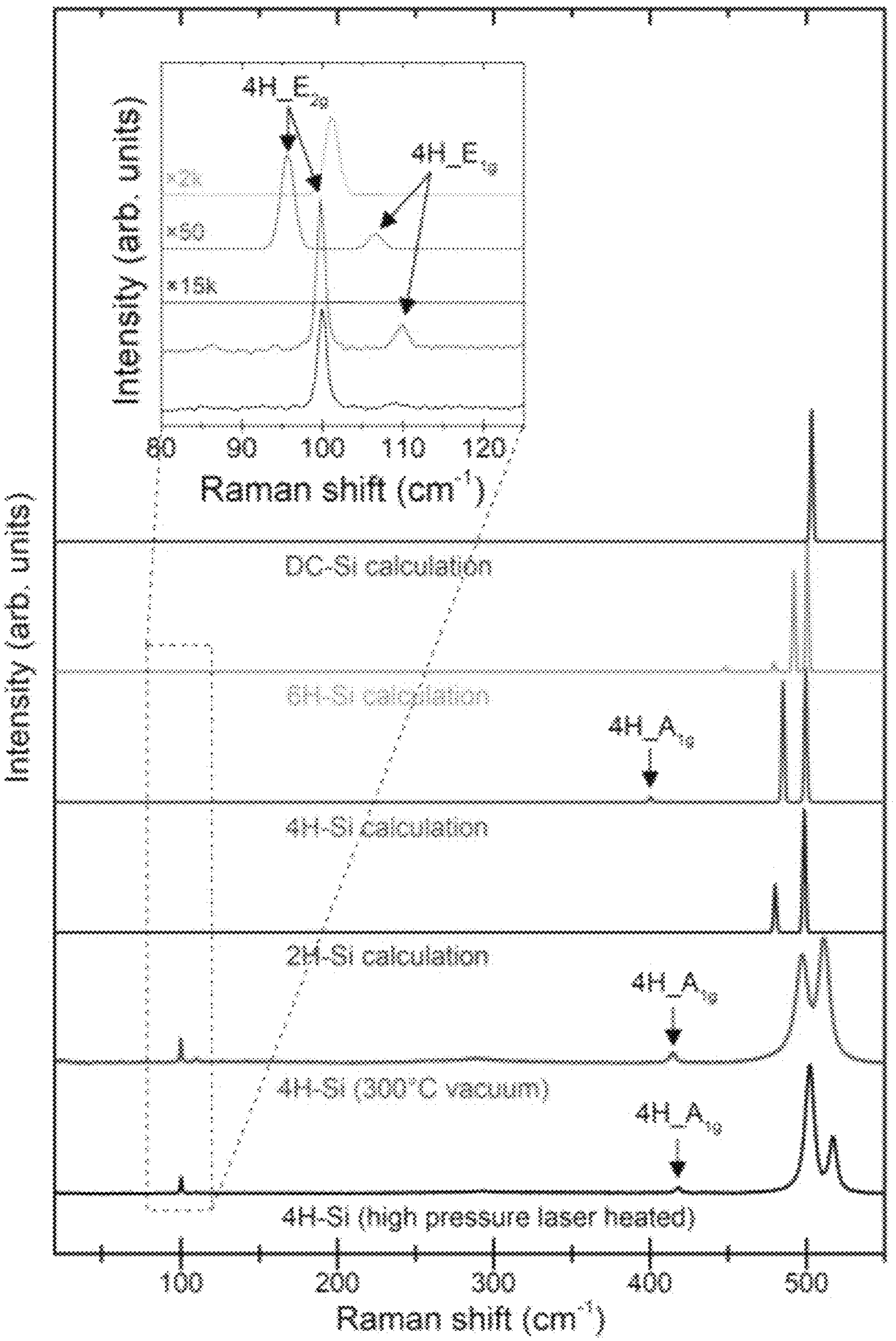
FIG. 7 is a graph of the Raman spectra of 4H-Si samples synthesized from $Si_{24}$ after annealing at 300° C. under vacuum, and via high-pressure laser heating. The experimental spectra are compared with calculated Raman spectra for different Si allotropes. The low-frequency region is shown in the inset.

Also illustrated in FIG. 7, Raman spectra of 4H-Si samples synthesized from $Si_{24}$ after annealing at 300° C. under vacuum, and via high-pressure laser heating are graphed. Also shown are calculated Raman spectra for the 2H-, 4H-, 6H-, and DC-Si structures with peaks of an arbitrary Gaussian width. The experimental spectra are scaled to the height of their most intense peak, shown in the inset of FIG. 7, a region of the Raman spectra demonstrating that the two low-frequency peaks from the 4H-Si calculation match the experimental observations. The intensity is scaled in this region to allow qualitative comparison. The calculations are performed using crystalline structures at 0 K with the harmonic approximation, and exhibit ~3% lower phonon frequencies as compared with the experimental Raman peaks which were measured at room temperature.

The calculated Raman spectrum for 4H-Si is in excellent agreement with the experimental data with a small consistent shift (~3%) to lower frequencies that may be explained by the static (0 K) calculation and the harmonic approximation used in the Raman calculation. The calculated 4H-Si spectrum has three intense peaks ($E_{2g}$, $E_{1g}$, and the $A_{1g}$) near 500 $cm^{-1}$, however, the calculated $E_{1g}$ and the $A_{1g}$ modes occur at very similar frequencies and are not resolved. This agrees with previous calculations for the hexagonal diamond polytypes of C and Si. The lower-frequency peaks at 100, 108, and 416 $cm^{-1}$ are characteristic of the 4H-Si structure and clearly distinguish this phase from other possible hexagonal stacking sequences. While the sample microstructure contributes to the width of the observed peaks, the resolution of these Raman spectra are exceptional compared with all previous bulk studies, and show all Raman-active phonon modes allowing clear disambiguation of the 4H hexagonal stacking sequence. Previously reported spectra do not show the low frequency modes, are broad, and/or contain significant amorphous Si.

Figure 8:
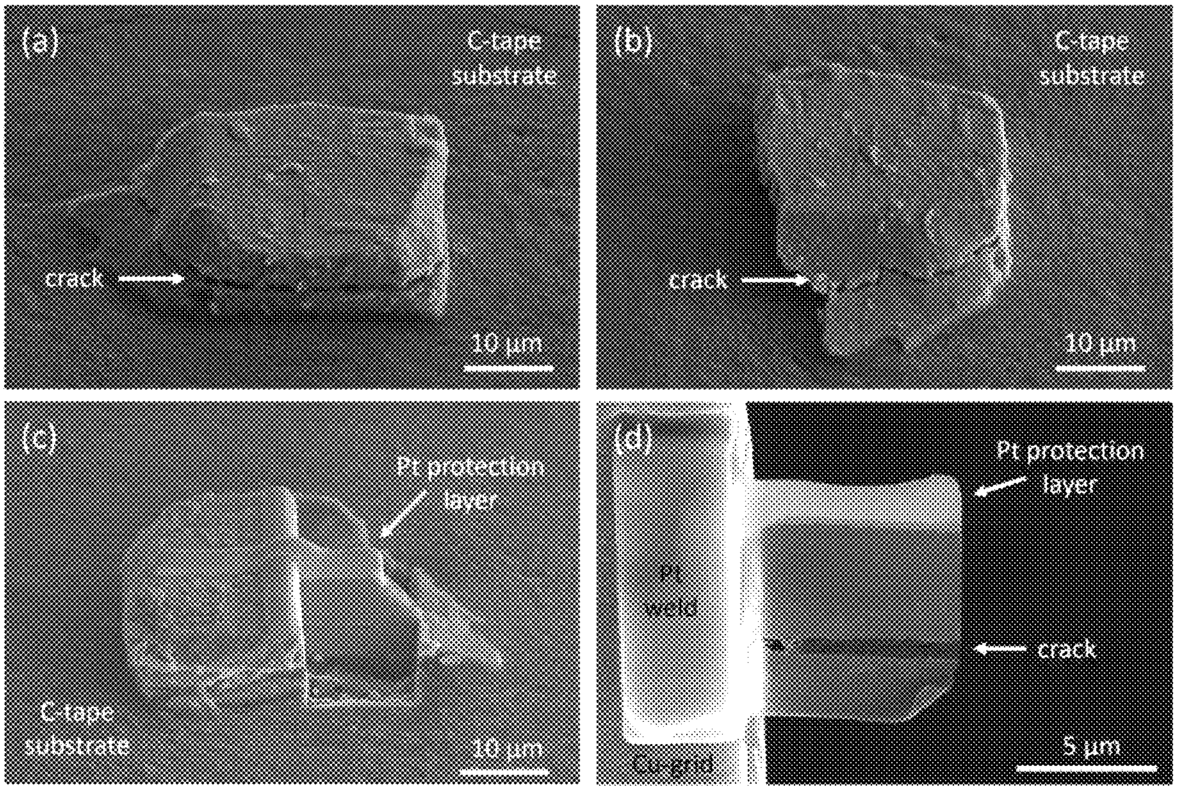
FIG. 8 is a four-part images series of an electron image captured in the FIB of the laser-heated 4H-Si crystal on the C-tape substrate before FIB processing and TEM analysis.

To further probe the structure of the annealed material, samples were placed onto a carbon tape substrate and transferred into a focused-ion-beam (FIB, FEI Scios) for imaging and TEM sample preparation, as illustrated in FIG. 8. FIG. 8 shows electron imagery captured in the FIB of the laser-heated 4H-Si crystal on the C-tape substrate before FIB processing and TEM analysis. This image reveals a crack propagating through the sample. The image in FIG. 8B of the same sample rotated 90° showing that the crack propagates all the way through the sample. In FIG. 8C, the sample after depositing a Pt layer to protect it during the milling process is shown. Channels have been cut on either side of the lamella. In FIG. 8D the lamella is shown attached to a Cu TEM grid with a Pt weld before the final thinning step.

Figure 3A:
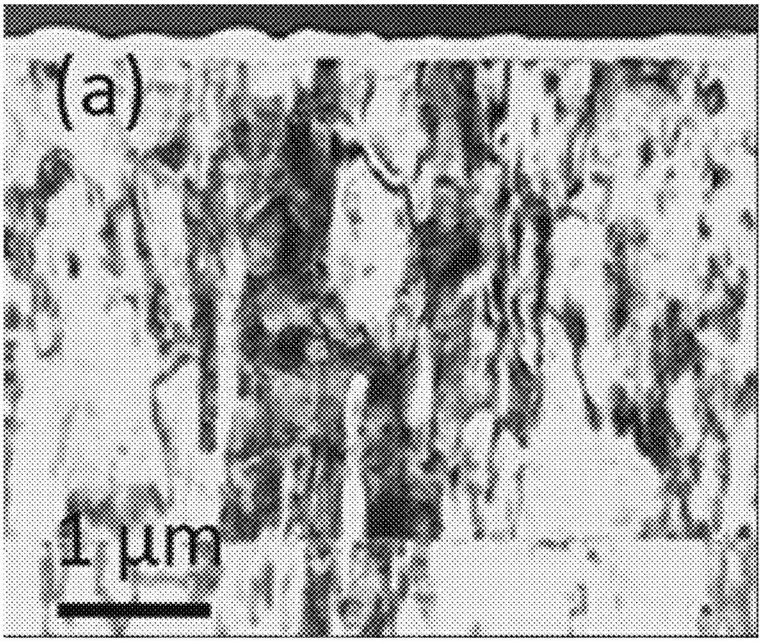
FIG. 3A is a bright-field TEM image of a lamella from an annealed $Si_{24}$ crystal.
Figure 3B:
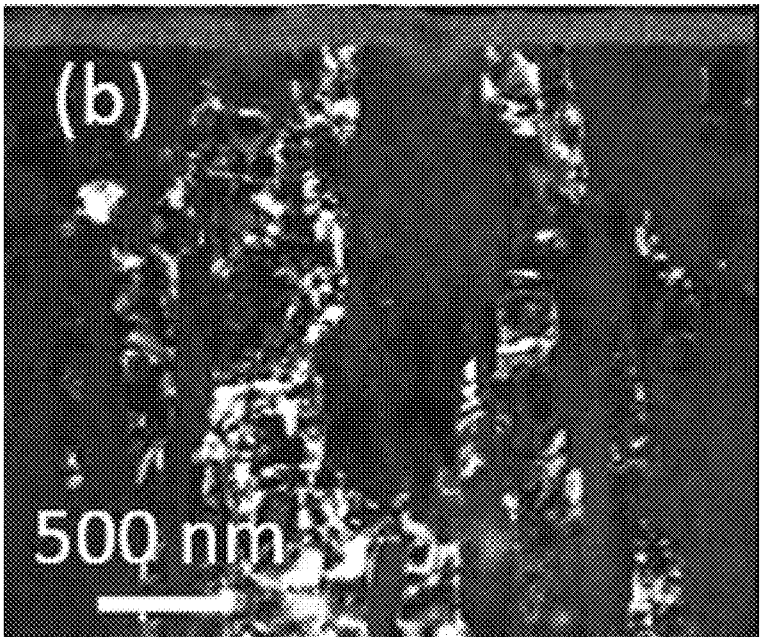
FIG. 3B is a Dark-field TEM image taken from the (002) reflection.
Figure 3C:
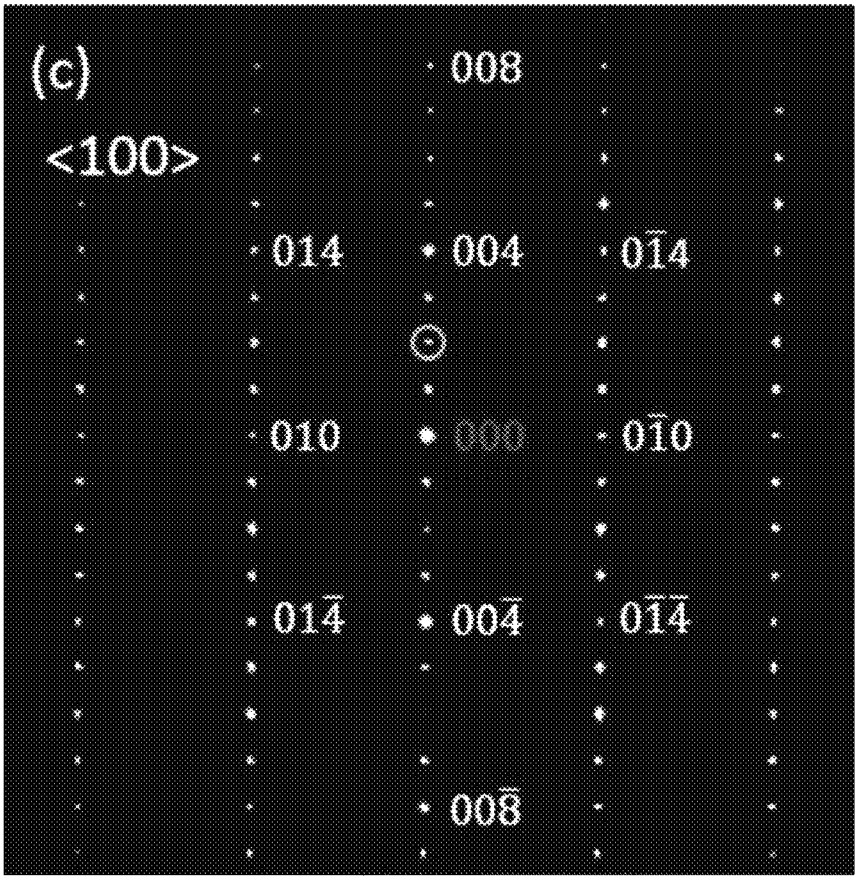
FIG. 3C is a SAED pattern which has been indexed to the <100> zone of 4H-Si and the (002) reflection of FIG. 3B is indicated by the circle in FIG. 3C.
Figure 3D:
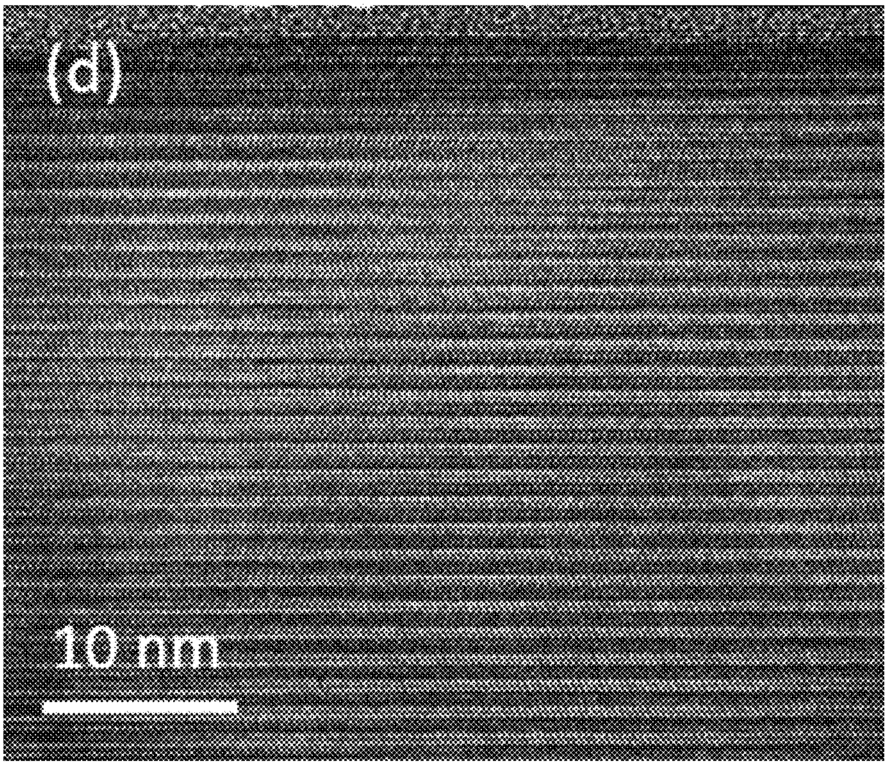
FIG. 3D is a high-resolution TEM image of a 4H-Si crystal.
Figure 3E:
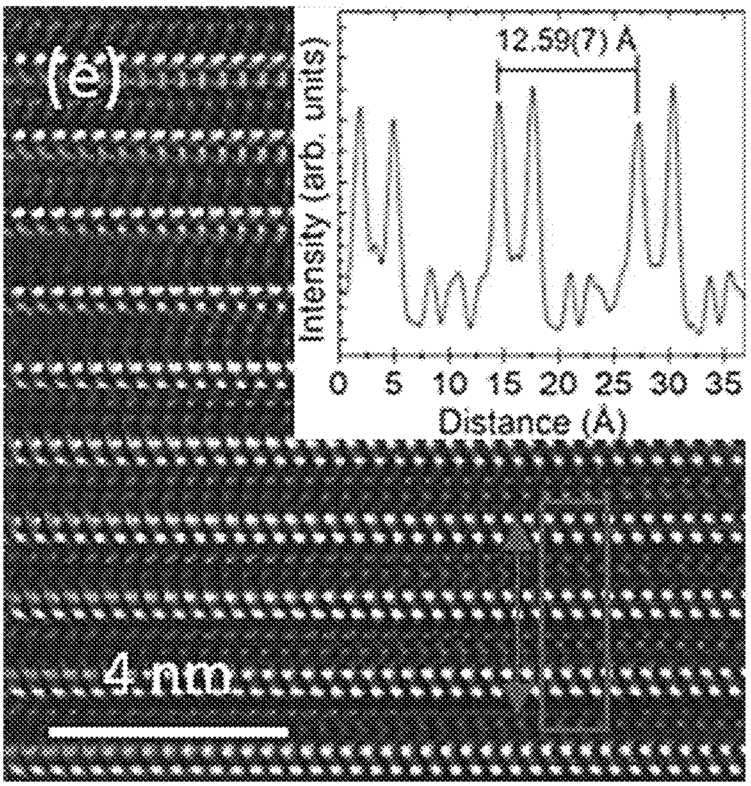
FIG. 3E is a Fourier-filtered image of a select region of the 4H-Si crystal of FIG. 3D with an inset graphing the intensity profile from the region inside the rectangle which shows the 12.59(7) Å periodic spacing between layers in the 4H-Si crystal. All images and diffraction patterns are viewed along the <100> axis.
Figure 9A:
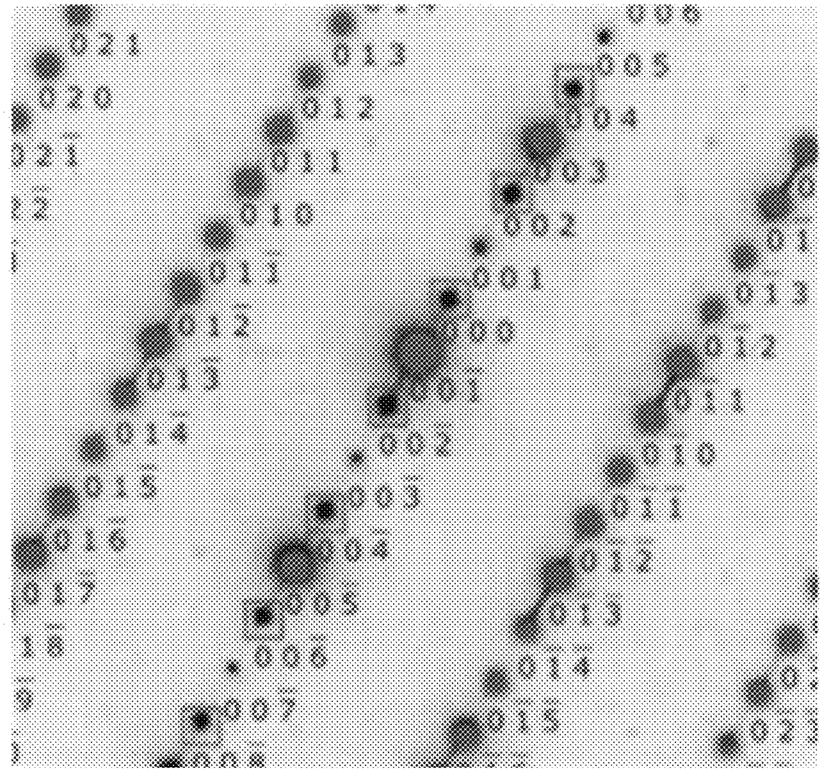
FIG. 9A is an SAED pattern from 4H-Si showing "forbidden reflections" and FIG. 9B is the same SAED pattern with a 2D vector representation of reflections.
Figure 9B:
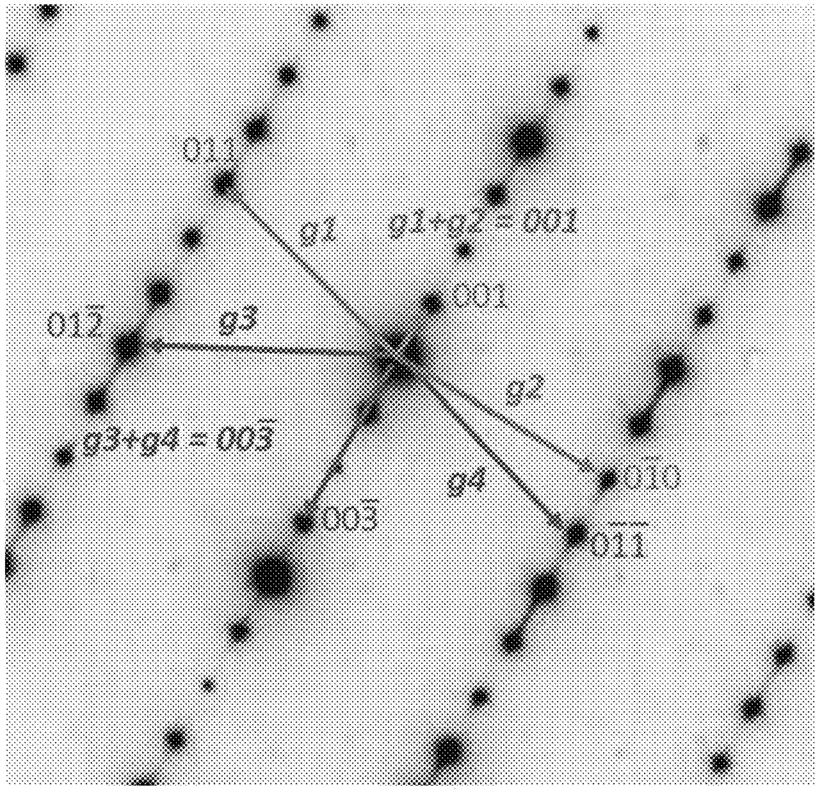
Figure 10:
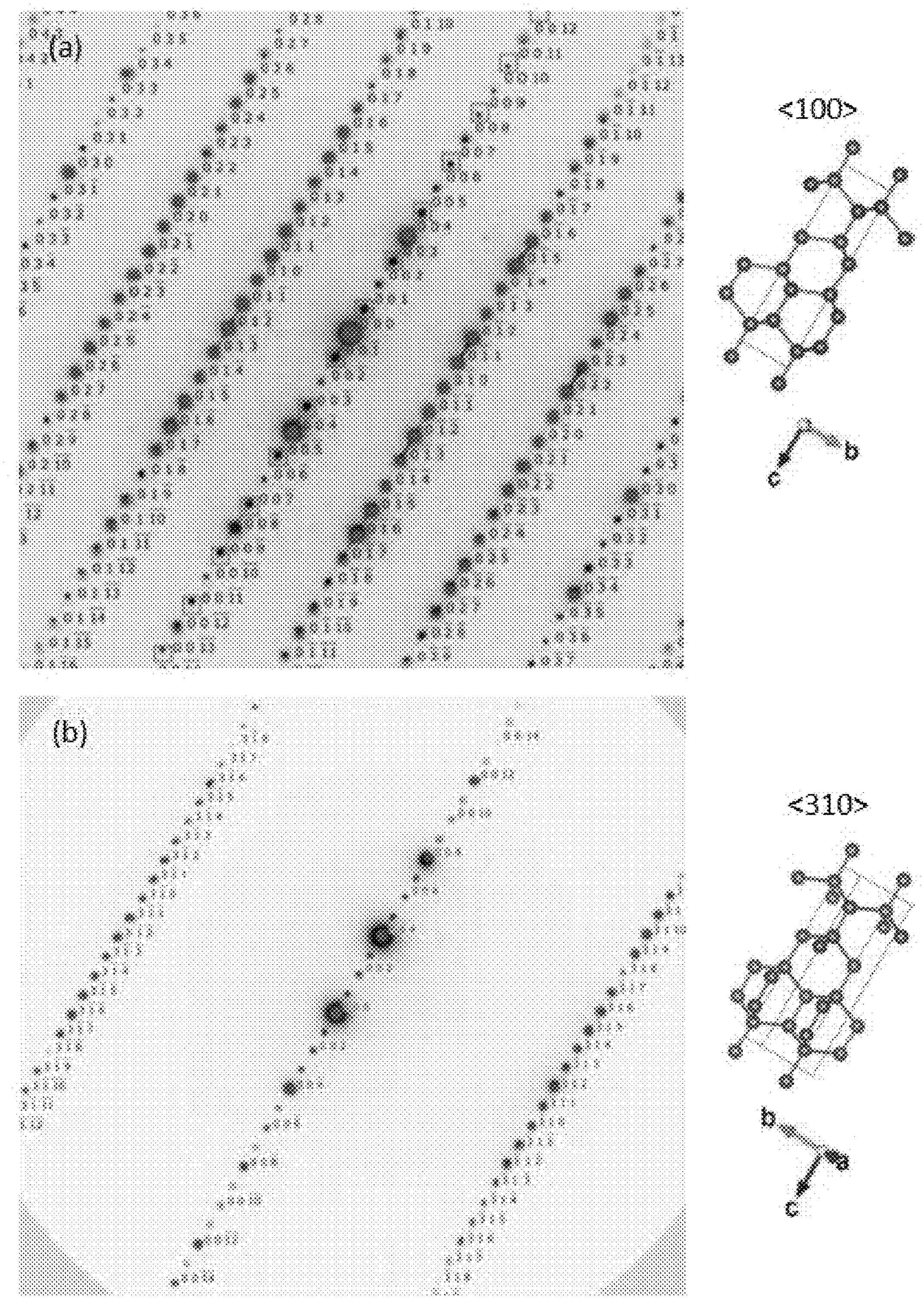
FIG. 10 illustrates SAED patterns of 4H-Si captured along the (a)<100> and (b) <310> zones.

FIGS. 3A and 3B show both bright and dark-field TEM images of a thinned section with crystalline grains exhibiting an average diameter of ~0.5 SAED patterns of the thinned section reveal sharp diffraction spots that index to the {100} zone of 4H-Si [FIG. 3C]. Notably, the {100} zone is anticipated from FIB milling geometry, which rotates the starting [001] oriented crystals by 90° while creating the lamella. The diffraction pattern exhibits {001} reflections where 1=odd, which are formally forbidden by the $P6_3/mmc$ structure (FIGS. 9A and 9B). Diffraction vector analysis reveals that these reflections originate from double diffraction (dynamical scattering), which is common for DC-Si. Several other measured diffraction zones obtained by tilting the sample confirm the 4H-Si lattice with a=3.84(5) Å and c=12.59(7) Å (FIG. 10). A high-resolution TEM image of a crystalline region of the lamella is shown in FIG. 3D. The Fourier-filtered image shown in FIG. 3E highlights the well-ordered layers of the 4H-Si material with a 12.59(7) Å periodicity along the c-axis, confirming the stacking sequence.

Figure 4A:
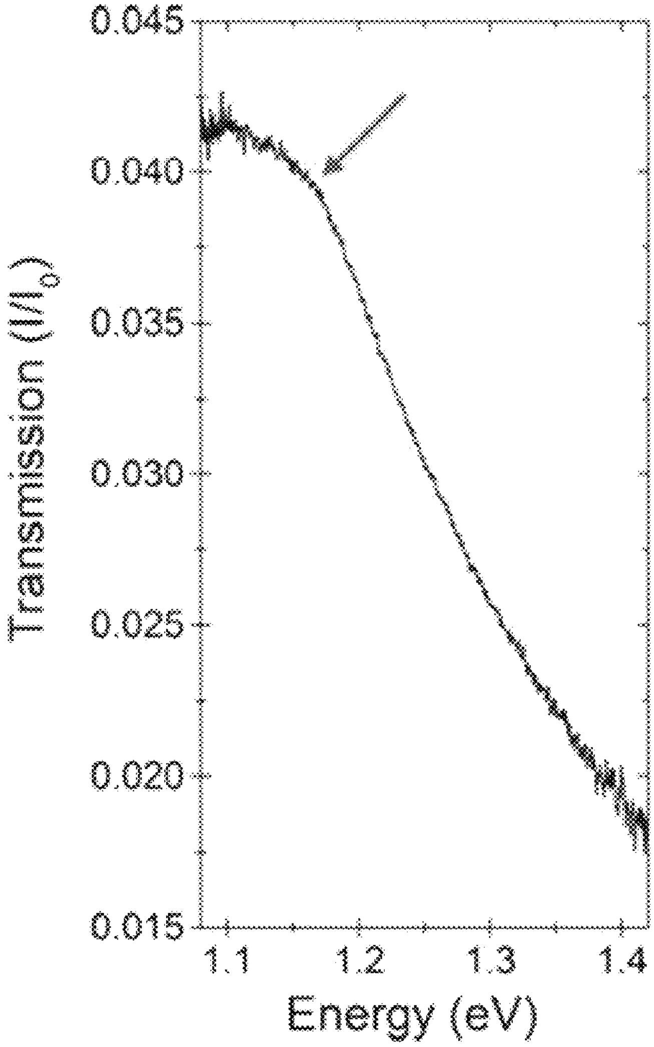
FIG. 4A illustrates the NIR-VIS transmission measurement of a piece of 4H-Si with a change in slope between 1.15-1.2 eV highlighting an absorption edge indicated by the arrow.
Figure 4B:
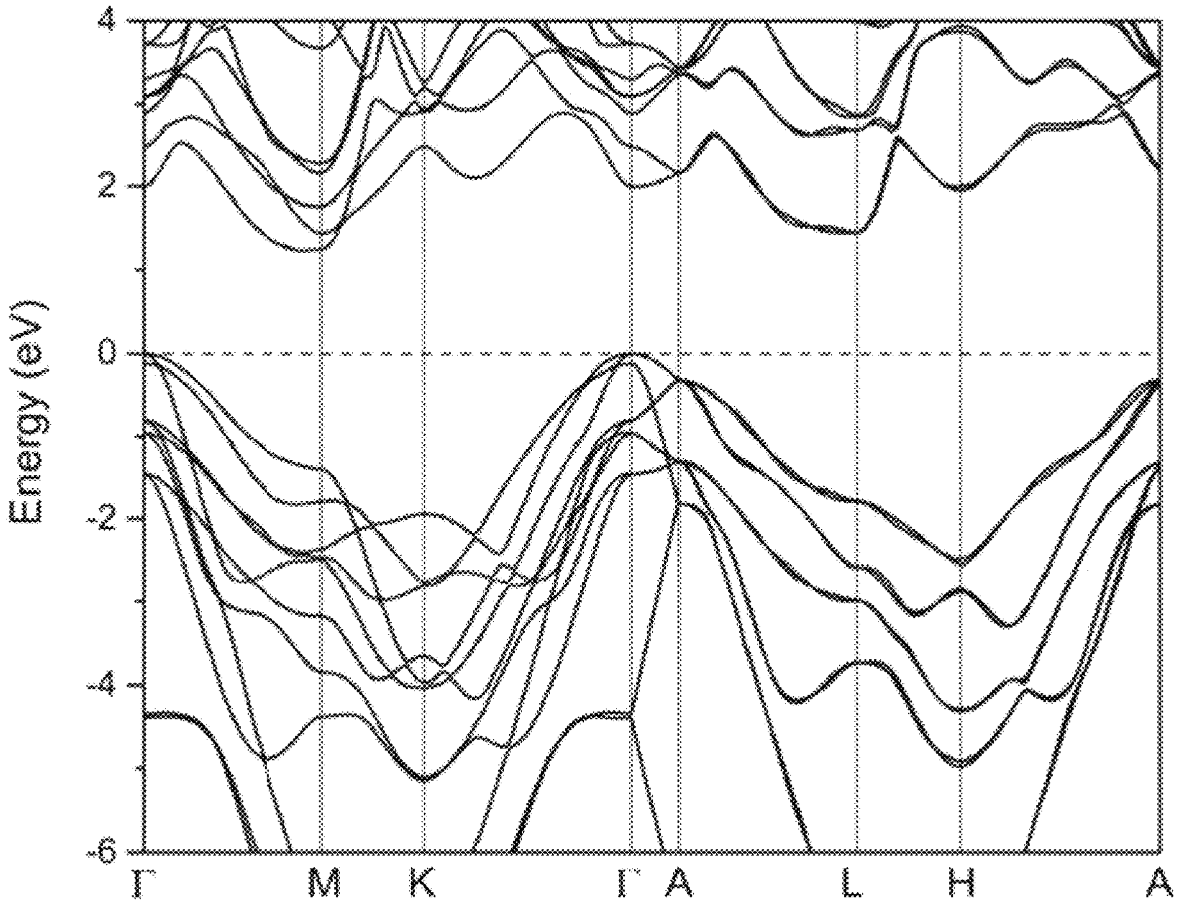
FIG. 4B graphs the calculated band structure for 4H-Si displaying an indirect band gap of 1.2 eV in the Γ-M direction.

A piece of 4H-Si (~100 μm×100 μm×10 μm), synthesized from a $Si_{24}$ crystal annealed at 300° C. in air, was selected for near-infrared, visible (NIR-VIS) transmission measurements to probe the optical properties and electronic structure. The transmission spectrum, FIG. 4A, shows distinct change in slope between 1.15-1.2 eV, indicating the onset of the optical (NIR) band gap. The multicrystalline nature of the sample, which is composed of individual grains ~0.5 μm based on TEM, likely contributes to the width of the absorption edge. Previous calculations show indirect band gaps with similar magnitudes for Si polytypes with varying hexagonalities, and predict that the band gap of 2H-Si should be slightly smaller than that of DC-Si, with 4H-Si in between. Using DFT, the band gap of 4H-Si using the Heyd-Scuseria-Ernzerhof (HSE06) hybrid functional is estimated, which tends to reproduce experimental values for a range of materials. In agreement with previous calculations, the calculated band structure shows that 4H-Si is a semiconductor with an indirect band gap of ~1.2 eV (Γ→M), matching closely with the experimental absorption results.

From a thermodynamic perspective, 4H-Si is metastable by 4 meV/atom (DFT PBE) with respect to DC-Si, and like the $Si_{24}$ precursor, 4H-Si represents another metastable allotrope of silicon. The energetic stabilization of 4H-Si compared with 2H-Si, which is 12 meV/atom higher than DC-Si, provides driving force to the observed stacking sequence. This energy difference also supports the claim of the 4H-Si (opposed to lonsdaleite) structure from the BC8 pathway. Energy calculations are similar to those by Raffy et al. using DFT LDA, which are 2.4 meV and 10.7 meV for 4H-Si and 2H-Si, respectively.

Figure 11:
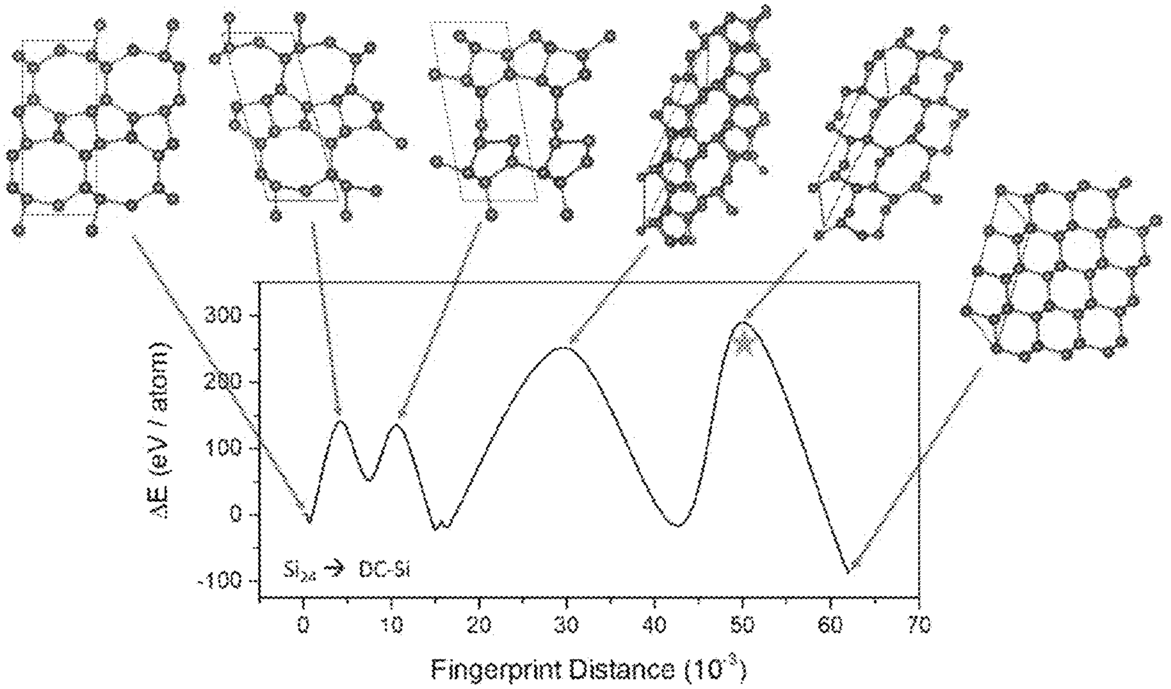
FIG. 11 illustrates the lowest-energy reaction pathway for the $Si_{24}$ to DC-Si transformation calculated using the Pallas method.
Figure 12:
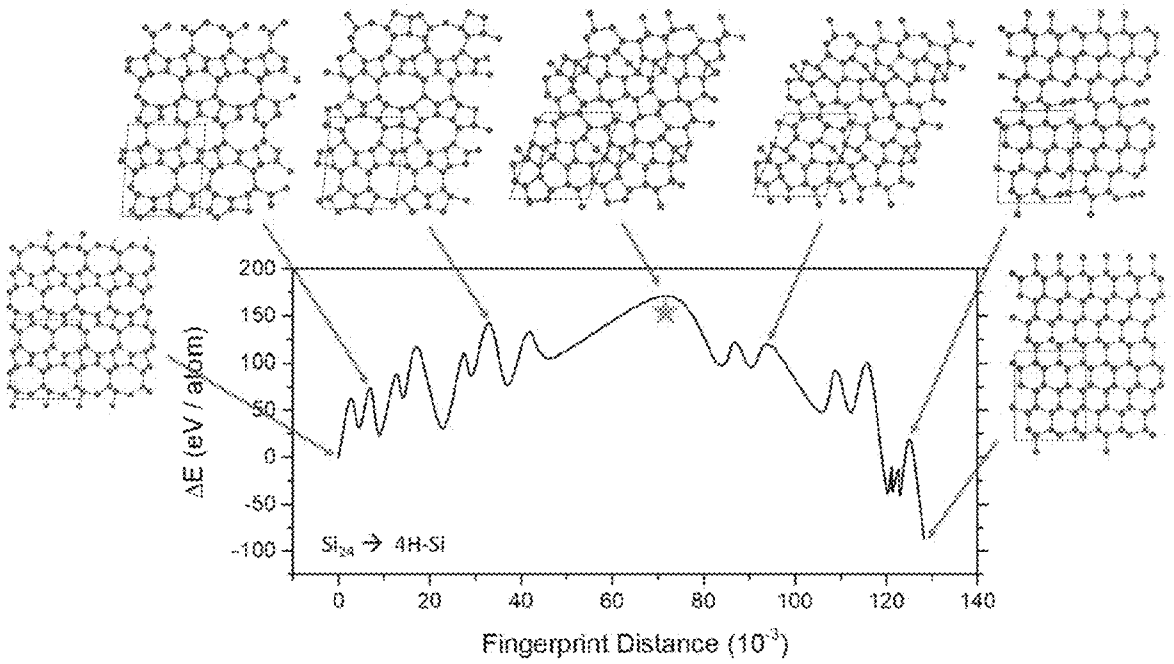
FIG. 12 illustrates the lowest-energy reaction pathway for the $Si_{24}$ to 4H-Si transformation calculated using the Pallas method.

The crystallographic alignment of the resulting 4H-Si crystallites with the original $Si_{24}$ crystals suggests an orientation relationship between the two metastable structures. To probe the underlying transition mechanism, a network of low-energy transition pathways was calculated using the Pallas method. This method was developed to predict solid-state transition pathways. The lowest-energy pathway involves the collapse of 8-membered rings in $Si_{24}$, followed by the formation of intermediate states with 4-, 5-, and 7-membered rings, which ultimately transform to the 4H structure with exclusively 6-membered rings, as illustrated in FIGS. 11 and 12. FIG. 11 illustrates the lowest-energy reaction pathway for the $Si_{24}$ to DC-Si transformation calculated using the Pallas method using 24 atoms per cell. The maximum energy barrier of 279 meV/atom is indicated by the star in the graph. FIG. 12 illustrates the lowest-energy reaction pathway for the $Si_{24}$ to 4H-Si transformation calculated using the Pallas method using 24 atoms per cell. The maximum energy barrier of 170 meV/atom is indicated by the star in the graph.

Figure 4C:
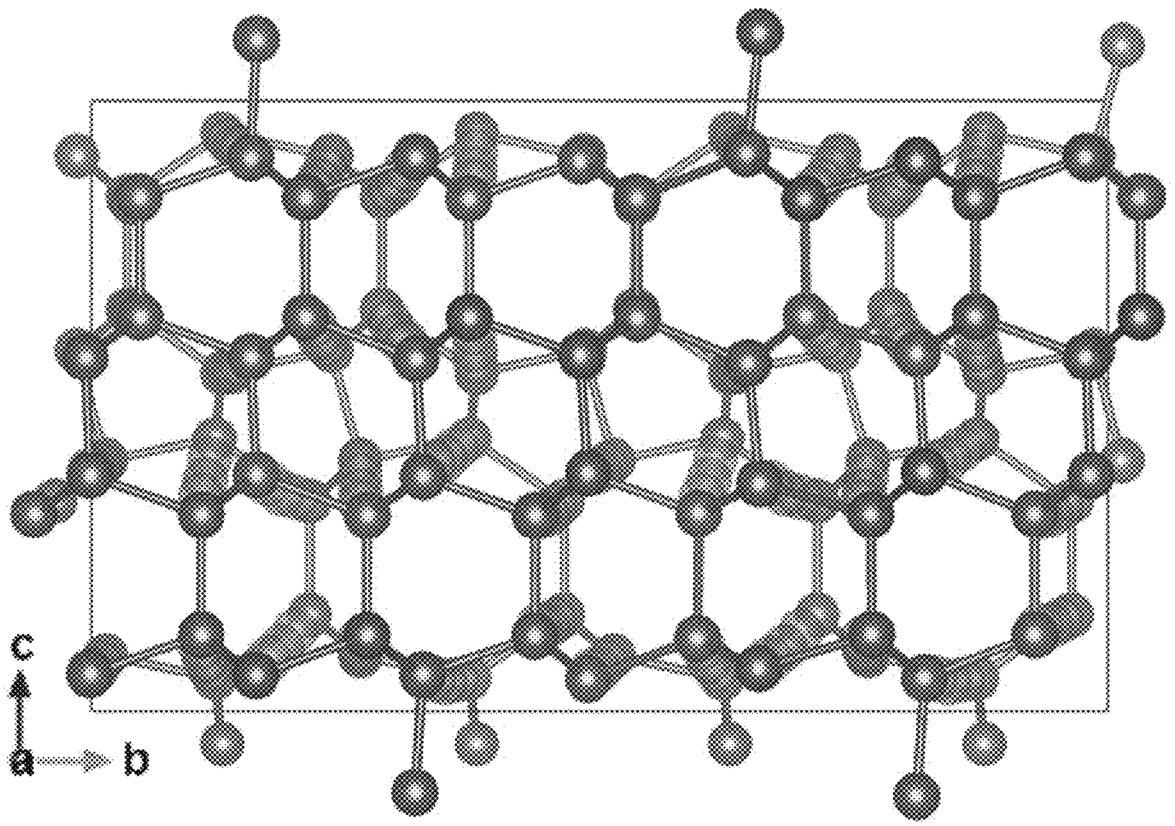
FIG. 4C is a ball-and-stick schematic illustrating the lowest-energy transition pathway from $Si_{24}$ (translucent spheres) to 4H-Si (shaded spheres), and the schematic was generated using theVESTA-v3 software. Translucent spheres indicate atomic displacements during the transition.
Figure 13:
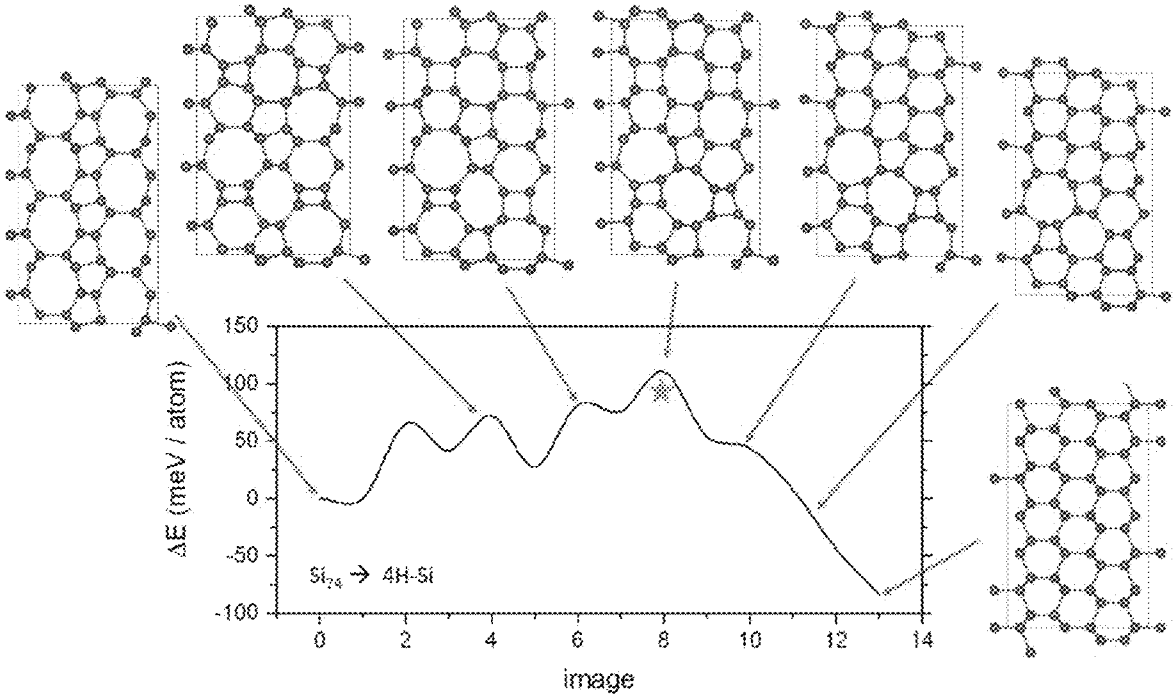
FIG. 13 illustrates the lowest-energy reaction pathway for the $Si_{24}$ to 4H-Si transformation calculated using the solid-state NEB method. Selected transition state images are shown along the transition pathway.

This lowest-energy path possesses a transition barrier of 170 meV/atom, which is significantly lower than lowest-energy transition path to DC-Si calculated to be 279 meV/atom under the same approach. While these calculations help to explain why 4H-Si is observed rather than DC-Si, the large unit cell (24 atoms) places limitations for adequately sampling configurational space, and lower-energy mechanisms may exist. Fortunately, the transition mechanism identified by Pallas provides significant insights into how minor atom displacements from the $Si_{24}$ structure could lead to 4H-Si with retention of crystallinity. Atomic displacement vectors for the lowest-energy path from $Si_{24}$ to 4H-Si are shown in FIG. 4C. It is clear that four layers of Si atoms are present in both structures along the c axis, and the cell vectors are very similar. For $Si_{24}$, a=3.82 Å, c=12.63 Å, which is similar to 4H-Si in which a=3.84(1) Å, c=12.59(1) Å. Using this information, the transition path was calculated from $Si_{24}$ to 4H-Si using a supercell consisting of 48 atoms using the variable cell nudged elastic band method (NEB), which is suitable for larger systems, but requires the definition of atoms across the transition determined from the Pallas calculation. The NEB-optimized path determined using a 48-atom cell shows a similar mechanism to the one derived from Pallas, but the barrier is reduced to 110 meV/atom after accounting for the cell geometries, as illustrated in FIG. 13. In FIG. 13, the lowest-energy reaction pathway for the $Si_{24}$ to 4H-Si transformation calculated using the solid-state NEB method with 48 atoms per cell. The maximum energy barrier of 110 meV/atom is indicated by the star in the graph. Experimental results confirm the conversion pathway.

Materials synthesis The 4H-Si samples measured using synchrotron XRD were synthesized from $Na_4Si_{24}$ crystals that had been annealed under vacuum ($3\times10^{-3}$ torr) at 300° C. for 4 days. The $Na_4Si_{24}$ crystals were synthesized using the high-pressure method described in refs [1,2]. The high-quality 4H-Si crystals that were analyzed using electron microscopy were synthesized using high-pressure laser heating in a diamond anvil cell (DAC). This synthesis was performed at the HPCAT 16-ID-B beamline at the Advanced Photon Source, Argonne National Laboratory. For this experiment, $Si_{24}$ crystals were loaded into a DAC with 700 μm culets, a rhenium gasket pre-indented to a thickness of 90 with a helium pressure medium. The $Si_{24}$ crystals were then compressed to 9 GPa. Note that it is important to keep the $Si_{24}$ crystals below 10-11 GPa as they will transform into β-Sn—Si at higher pressures. [3] While at 9 GPa the $Si_{24}$ crystals were heated lightly for 1-2 minutes at 1050 K using a 1064 nm double-sided laser heating system, before being slowly cooled and decompressed. FIG. 6 shows optical images of the laser heated products after decompression.

X-ray diffraction The synchrotron radiation XRD patterns were measured on the HPCAT 16-ID-B beamline at the Advanced Photon Source, Argonne National Laboratory. These XRD measurements used a 30 keV beam (FWHM=4×6 μm) and the diffracted X-rays were captured on a Pilatus-1M detector. Wide angle patterns were collected on each of the crystalline samples which were either mounted on Kapton tape secured inside a stainless-steel ring. Each sample was rotated in the beam from −5° to +5° at 0.5°/s. The patterns were then processed using DIOPTAS 0.5.0 software to remove the background signal and to mask effects from the detector apparatus. [4]

Raman spectroscopy All experimental Raman spectra were measured on an in-house system using a 532 nm excitation laser, 1800 grooves/mm diffraction grating, and a Princeton Instruments Si-CCD detector. A neutral density filter was used to keep the incident laser power below 2 mW to avoid damage to the samples. A Raman spectrum of a 4H-Si crystal synthesized in a DAC, and the calculated spectra of the DC-, 2H-, 4H-, and 6H-Si structures are shown in FIG. 7.

Electron microscopy A FEI-SCIOS dualbeam FIB-SEM was used to image the surface of the recovered samples and to prepare electron transparent lamellae allowing the microstructure to be viewed using a TEM. Select images of the lamella generation process are shown in FIG. 8. The final thickness of the lamella was ~80 nm. TEM imaging and SAED were performed using either JEOL JEM 2100F or JEOL JEM F-200 electron microscopes operating at 200 kV. FIG. 10 displays two SAED patterns of the DAC synthesized 4H-Si crystalline sample captured along the <100> and <310> zones which have been fully indexed using the Crystal Maker (Single Crystal) software package.

Optical measurements NIR-VIS transmission measurements were performed using a Bruker Vertex-70 spectrometer with a Hyperion microscope. The light source was a water-cooled halogen lamp, and the signal was collected using a Si-diode detector. Two rectangular slits with dimensions 40×40 μm were positioned above and below the sample to filter the incoming and outgoing light. In this case, the sample was mounted on top of a CVD-grown single crystal diamond window (~500 μm thick), which also served as the absorbance reference.

First-principles calculations The first-principles calculations were performed in the framework of density functional theory using the Perdew-Burke-Ernzerhof (PBE) functional, [5] as implemented in the Vienna Ab Initio Simulation Package (VASP) code. [6] The all-electron projector augmented wave (PAW) [7,8] method was adopted, with the PAW potential treating $3s^2 3p^2$ as the valence electrons. An energy cut-off of 520 eV and appropriate Monkhorst-Pack k meshes (listed below) were chosen to ensure that the total energy calculations converged within a 1 meV/formula unit. Specifically, the k point sets for 4H-Si, $Si_{24}$, and the 48-atom supercell are chosen to be [9×9×9], [8×3×3], and [4×2×2], respectively. Hellman-Feynman force components were relaxed to at least 0.01 eV/A in the structural optimizations. Theoretical Raman intensities were calculated using the density functional perturbation theory (Fonari-Stauffer method). [9] To estimate an accurate band gap, we used the Heyd-Scuseria-Ernzerhof (HSE06) hybrid functional. [10]

Thus a new pathway for 4H-Si synthesis, which is now possible from $Si_{24}$ and BC8-Si precursors has been invented and disclosed herein. The $Si_{24}$ pathway appears advantageous as large crystals (>1 μm) of the parent BC8-Si phase are generally not observed. Hence, the only way to synthesize large 4H-Si crystals is via the $Si_{24}$ route. Furthermore, the fact that 4H-Si can be formed from multiple precursors at elevated temperature (200-300° C.) motivates future studies to probe the stability and transitions of other Si phases at high temperature. The availability of large $Si_{24}$ precursor crystals and resultant 4H-Si product invites future studies using deposition and epitaxial growth methods, which could further enhance the quality and applications of both allotropes. The influence of strain on the optical and electrical properties of 4H-Si is also an enticing topic for further study. Applying strain via atomic Ge substitution or via deposition growth with a mismatched lattice substrate may enhance the optical absorption properties, increase charge mobilities, or even transform 4H-Si into a direct band gap semiconductor. Similar effects have recently been predicted for 2H-Si using ab initio modeling.

The present invention teaches a novel multistep synthesis pathway to produce crystalline 4H-Si from a crystalline $Si_{24}$ precursor, in contrast to previous synthesis methods which yield only disordered and amorphous materials. Optical absorption measurements reveal an indirect band gap near 1.2 eV, in close agreement with first principles calculations of the electronic band structure. The invention teaches the method for synthesis of larger crystals which can be isolated. The synthesized 4H-Si taught herein can be used as seed crystals for growing large volumes of 4H-Si nanowires and solar devices with absorption and optoelectronic properties exceeding those of DC-Si.

The invention claimed is:

1. A 4H-Si crystalline allotrope of silicon, comprising a 4H structure with highly oriented microcrystals.

2. The 4H-Si crystalline allotrope of silicon of claim 1, wherein the 4H-Si crystalline allotrope of silicon comprises a microcrystalline 4H silicon phase comprising no disordered material.

3. The 4H-Si crystalline allotrope of silicon of claim 1, wherein the 4H-Si crystalline allotrope of silicon exhibits characteristics of an indirect band gap semiconductor with a band gap near 1.2 eV.

4. The 4H-Si crystalline allotrope of silicon of claim 1, wherein the 4H-Si crystalline allotrope of silicon is produced by heating $Si_{24}$ between vacuum pressure ($10^{-3}$ torr) and 9 GPa at temperatures between 300° C. and 800° C.

5. The 4H-Si crystalline allotrope of silicon of claim 1, wherein structural conversion to the 4H-Si crystalline allotrope of silicon occurs: (a) when heating $Na_4Si_{24}$ under vacuum pressure at temperatures between 300° C. and 800° C., or (b) heating $Na_4Si_{24}$ at temperatures between 300° C. and 800° C. in the presence of iodine.

6. The 4H-Si crystalline allotrope of silicon of claim 1, wherein the 4H-Si crystalline allotrope of silicon is in a form of highly oriented 4H-Si grains.

7. The 4H-Si crystalline allotrope of silicon of claim 1, wherein the 4H-Si crystalline allotrope of silicon is in a form of powdered 4H-Si.

8. The 4H-Si crystalline allotrope of silicon of claim 7, wherein the powdered 4H-Si comprises grain sizes between approximately 0.4 microns and 0.6 microns.

9. The 4H-Si crystalline allotrope of silicon of claim 1, wherein the 4H-Si crystalline allotrope of silicon comprises a phase, and wherein the phase:

(i) comprises a lower-energy direct interband transition than a diamond-Si phase, and (ii) exhibits in-plane elastic isotropy, wherein occupation and energy-momentum dispersion of electronic states in reciprocal space varies between the 4H-Si crystalline allotropes of silicon, and wherein heterostructures are possible.

10. A 4H-Si crystalline allotrope of silicon comprising a highly oriented 4H phase silicon microcrystal structure synthesized from $Si_{24}$.

11. A 4H-Si crystalline allotrope of silicon, comprising a highly oriented 4H phase silicon microcrystal structure synthesized from $Na_4Si_{24}$.

12. A method of manufacture of 4H-Si crystalline allotrope of silicon, which comprises heating $Si_{24}$ to produce an allotrope of silicon as bulk, microcrystalline agglomerates, wherein the crystalline allotrope of silicon comprises a 4H structure with highly oriented microcrystals.

13. The method of claim 12, wherein the $Si_{24}$ is heated above 300° C. at atmospheric pressure.

14. The method of claim 12, wherein the $Si_{24}$ is heated to approximately 800° C. at a pressure near 9 GPa.

15. The method of claim 12, wherein the $Si_{24}$ is heated through a metastable phase transformation.

16. The method of claim 12, wherein the 4H-Si is produced by heating $Si_{24}$ between a vacuum pressure of $10^{-3}$ torr and 9 GPa at a temperature of between 300° C. and 800° C.

17. The method of claim 12, wherein upon heating the $Na_4Si_{24}$, single-crystalline $Si_{24}$ results in highly oriented 4H-Si grains, and powdered $Si_{24}$ results in powdered 4H-Si.

18. The method of claim 12, wherein heating $Si_{24}$ produces: (A) black powder, or (B) multicrystalline agglomerates comprising grain sizes near 0.5 microns.

19. The method of claim 12, further comprising applying strain via atomic Ge substitution to enhance optical absorption properties of the 4H-Si.

20. The method of claim 12, further comprising applying strain via atomic Ge substitution to increase charge mobilities of the 4H-Si.

21. The method of claim 12, further comprising performing deposition growth with a mismatched lattice substrate to enhance optical absorption properties of the 4H-Si.

22. The method of claim 12, further comprising performing deposition growth with a mismatched lattice substrate to increase charge mobilities of the 4H-Si.

23. The method of claim 12, further comprising providing 4H-Si as seed crystals for growing large volumes of 4H-Si, wherein the produced 4H-Si comprises absorption and optoelectronic properties exceeding those of DC-Si.

24. The method of claim 12, further comprising providing 4H-Si as seed crystals for growing large volumes of 4H-Si solar devices, wherein the 4H-Si solar devices comprise absorption and optoelectronic properties complementing or exceeding those of DC-Si.

25. A method of manufacture of 4H-Si crystalline allotrope of silicon from a starting material of $Na_4Si_{24}$, which comprises heating $Na_4Si_{24}$ in the presence of iodine, wherein the crystalline allotrope of silicon comprises a 4H structure with highly oriented microcrystals.

26. The method of claim 25, wherein structural conversion to 4H-Si from $Na_4Si_{24}$ is dependent on temperature and heating duration.

* * * * *